(12) United States Patent
Kamata et al.

(10) Patent No.: US 8,841,139 B2
(45) Date of Patent: Sep. 23, 2014

(54) MAGNETIC MEMORY AND METHOD OF FABRICATING THE SAME

(71) Applicants: Chikayoshi Kamata, Kawasaki (JP); Minoru Amano, Sagamihara (JP); Tadaomi Daibou, Yokohama (JP); Junichi Ito, Yokohama (JP)

(72) Inventors: Chikayoshi Kamata, Kawasaki (JP); Minoru Amano, Sagamihara (JP); Tadaomi Daibou, Yokohama (JP); Junichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 13/623,306

(22) Filed: Sep. 20, 2012

(65) Prior Publication Data
US 2013/0249028 A1  Sep. 26, 2013

(30) Foreign Application Priority Data

Mar. 21, 2012  (JP) .................................. 2012-064282

(51) Int. Cl.
*H01L 21/00* (2006.01)

(52) U.S. Cl.
USPC ......... 438/3; 438/455; 438/458; 257/E21.001

(58) Field of Classification Search
USPC ............................................................ 438/3
See application file for complete search history.

(56) References Cited

U.S. PATENT DOCUMENTS

| 7,379,280 | B2 * | 5/2008 | Fukumoto et al. | 360/324.2 |
| 8,513,748 | B2 * | 8/2013 | Fukumoto | 257/421 |
| 2004/0110320 | A1 | 6/2004 | Aspar et al. | |
| 2006/0176735 | A1 | 8/2006 | Yuasa | |
| 2007/0224707 | A1 * | 9/2007 | Hosotani | 438/3 |
| 2009/0207532 | A1 | 8/2009 | Furuya et al. | |
| 2010/0188891 | A1 * | 7/2010 | Taniguchi et al. | 365/158 |
| 2011/0227018 | A1 * | 9/2011 | Kuribayashi et al. | 257/2 |
| 2012/0315707 | A1 * | 12/2012 | Nam | 438/3 |
| 2013/0069182 | A1 * | 3/2013 | Ohsawa et al. | 257/421 |
| 2013/0249025 | A1 * | 9/2013 | Natori et al. | 257/421 |

FOREIGN PATENT DOCUMENTS

| JP | 2006-295049 | 10/2006 |
| WO | WO 2009/031387 A1 | 3/2009 |

OTHER PUBLICATIONS

U.S. Appl. No. 13/826,408, filed Mar. 14, 2013, Kato, et al.
Office Action issued Nov. 1, 2013 in Japanese Application No. 2012-064282 (With English Translation).

* cited by examiner

*Primary Examiner* — Angel Roman
(74) *Attorney, Agent, or Firm* — Oblon, Spivak, McClelland, Maier & Neustadt, L.L.P.

(57) ABSTRACT

A method of fabricating a magnetic memory according to an embodiment includes: forming a separation layer on a first substrate; sequentially forming a first ferromagnetic layer, a first nonmagnetic layer, and a second ferromagnetic layer on the separation layer, at least one of the first and the second ferromagnetic layers having a single crystal structure; forming a first conductive bonding layer on the second ferromagnetic layer; forming a second conductive bonding layer on a second substrate, on which a transistor and a wiring are formed, the second conductive bonding layer electrically connecting to the transistor; arranging the first and second substrate so that the first conductive bonding layer and the second conductive bonding layer are opposed to each other, and bonding the first and the second conductive bonding layers to each other; and separating the first substrate from the first ferromagnetic layer by using the separation layer.

16 Claims, 24 Drawing Sheets

| | CONDUCTIVE BONDING LAYER 16a | CONDUCTIVE BONDING LAYER 16b | FERROMAGNETIC LAYER 13 | FERROMAGNETIC LAYER 15 | NONMAGNETIC LAYER 14 |
|---|---|---|---|---|---|
| 1ST EXAMPLE | Ta10nm | Ta10nm | MnGa10nm | MnGa30nm | MgO1nm |
| 2ND EXAMPLE | Ti10nm | Ta10nm | MnGa10nm | MnGa30nm | MgO1nm |
| 3RD EXAMPLE | Ti10nm | Ti10nm | MnGa10nm | MnGa30nm | MgO1nm |
| 4TH EXAMPLE | Ta10nm | Ti10nm | MnGa10nm | MnGa30nm | MgO1nm |
| 5TH EXAMPLE | Cu5nm/Ti3nm | Ta10nm | MnGa10nm | MnGa30nm | MgO1nm |
| 6TH EXAMPLE | Ta10nm | Ta10nm/Ru2nm | MnGa10nm | MnGa30nm | MgO1nm |
| 7TH EXAMPLE | Cu5nm/Ti3nm | Ti10nm | MnGa10nm | MnGa30nm | MgO1nm |
| 8TH EXAMPLE | Ta10nm | TiN10nm | MnGa10nm | MnGa30nm | MgO1nm |
| 9TH EXAMPLE | Ta10nm | TaN10nm | MnGa10nm | MnGa30nm | MgO1nm |
| 10TH EXAMPLE | Ta5nm | Ta5nm | MnGa10nm | MnGa30nm | SrTiO₃O1.8nm |
| 11TH EXAMPLE | Ta5nm | Ta5nm | MnAl1nm/MnGa10nm | MnGa30nm | MgO1nm |
| 12TH EXAMPLE | Ta5nm | Ta5nm | MnAl1nm/MnGa10nm | MnAl2nm/MnGa30nm | MgO1nm |
| 13TH EXAMPLE | Ta5nm | Ta5nm | MnGa10nm | CoFe30nm | MgO1nm |

FIG. 31

| | CONDUCTIVE BONDING LAYER 16a | CONDUCTIVE BONDING LAYER 16b | FERROMAGNETIC LAYER 13 | FERROMAGNETIC LAYER 15 | NONMAGNETIC LAYER 14 |
|---|---|---|---|---|---|
| 14TH EXAMPLE | Ta5nm | Ta5nm | MnGa10nm | TbFe$_2$30nm | MgO1nm |
| 15TH EXAMPLE | Ta10nm | Ta10nm | CoFe1nm/MnGa10nm | CoFe1nm/MnGa30nm | MgO1nm |
| 16TH EXAMPLE | Ta10nm | Ta10nm | CoFeB1nm/MnGa10nm | CoFeB1nm/MnGa30nm | MgO1nm |
| 17TH EXAMPLE | Cu5nm/Ti3nm | Ta10nm | MnGa10nm | CoFeB1nm/MnGa30nm | MgO1nm |
| 18TH EXAMPLE | Cu3nm/Ta5nm | Ta10nm | MnGa10nm | MnGa30nm | MgO1nm |
| 19TH EXAMPLE | Cu3nm/Ta5nm | Cu3nm/Ta5nm | MnGa30nm | MnGa30nm | MgO1nm |
| 20TH EXAMPLE | Ta10nm | Ta10nm | MnGa30nm | MnGa10nm | MgO1nm |
| 21ST EXAMPLE | Ti5nm | Ta5nm | MnGa30nm | MnGa10nm | MgO1nm |
| 22ND EXAMPLE | Cu3nm/Ta5nm | Ta10nm | MnAl2nm/MnGa30nm | MnAl1nm/MnGa10nm | MgO1nm |
| 23RD EXAMPLE | Ta10nm | Ta10nm | CoFe1nm/MnGa30nm | CoFe1nm/MnGa10nm | MgO1nm |
| 24TH EXAMPLE | Ta5nm | Ta5nm | CoFeB1nm/MnGa30nm | CoFeB1nm/MnGa10nm | MgO1nm |
| 25TH EXAMPLE | Ta5nm | Ta5nm | MnGa10nm | MnGa30nm | MgO1nm |
| 26TH EXAMPLE | Ta5nm | Ta5nm | MnGa10nm | MnGa30nm | Mg0.4nm/SrTiO$_3$1.8nm/Mg0.4nm |

FIG. 32

MAGNETIC MEMORY AND METHOD OF FABRICATING THE SAME

CROSS REFERENCE TO RELATED APPLICATIONS

This application is based upon and claims the benefit of priority from prior Japanese Patent Application No. 2012-064282 filed on Mar. 21, 2012 in Japan, the entire contents of which are incorporated herein by reference.

FIELD

Embodiments described herein relate generally to a magnetic memory and a method of fabricating the same.

BACKGROUND

In order to realize the ubiquitous society in the future, and as small portable appliances prevail, the demand for nonvolatile memory, which is small, has a large capacity, and is capable of reading and writing at a high speed and operating with a low power consumption, is increasing.

A magnetic random access memory (MRAM) using ferromagnetic tunnel junction showing a tunneling magnetoresistive (TMR) effect is drawing the attention as a next-generation solid-state nonvolatile memory. An MTJ (Magnetic Tunnel Junction) element with ferromagnetic tunnel junction has a stacked structure formed on a substrate, on which transistors and wirings are formed, the stacked structure including a first ferromagnetic layer (storage layer), in which the magnetization direction can be changed, a nonmagnetic layer (insulating tunnel barrier layer) and a second ferromagnetic layer (magnetization fixed layer), in which a predetermined magnetization direction is fixed.

When a current is caused to flow through a ferromagnetic tunnel junction, the current flows to tunnel through the tunnel barrier layer. In a magnetic memory device including an MTJ element with ferromagnetic tunnel junction as a memory cell, at least one ferromagnetic layer is assumed to be a reference layer, in which the magnetization direction is fixed, and another ferromagnetic layer is assumed to be a storage layer. In such a cell, it is possible to store information by assigning "0" or "1" of binary data to the parallel or antiparallel state of the magnetizations of the reference layer (magnetization fixed layer) and the storage layer.

The reading of information is performed by flowing a current to tunnel through the tunnel barrier layer and detecting the resistance value. In such a case, the resistance value of the MTJ element changes in accordance with the cosine of the relative angle between the magnetizations of the first and the second ferromagnetic layers. Furthermore, the junction resistance value is the lowest when the directions of magnetizations in the first and the second ferromagnetic layers are in a parallel state (the same direction), and the highest when they are in an antiparallel state (opposite directions). This change in resistance is called "tunneling magnetoresistive effect (TMR effect)."

As a method of recording of information to the storage layer, a method is suggested in which the MT) element is directly energized so that the magnetization of the storage layer is switched by the spin torque transfer from the reference layer (spin torque transfer switching method). In the spin torque transfer switching method, as the size of the memory cell decreases, the amount of current required for the writing decreases. Thus, it is possible to increase the capacity easily. The reading of information from the memory cell is performed by flowing a current through the ferromagnetic tunnel junction, and detecting a change in resistance caused by the TMR effect. A magnetic memory is formed by arranging a number of such memory cells.

The write efficiency of an MTJ element, in which the first and the second ferromagnetic layers have magnetizations that are parallel to the film plane, is not good. Therefore, it is difficult to increase the capacity of such an element to a giga-bit level. In contrast, the write efficiency of an MTJ element (also called "perpendicular magnetization MTJ element), in which the first and the second ferromagnetic layers have magnetizations that are perpendicular to the film plane, is good. Thus, it is possible to obtain a large capacity.

A conventional perpendicular magnetization MTJ element has been formed by forming a magnetic body with a polycrystalline structure or amorphous structure directly on transistors by sputtering. As a result, the in-plane orientation of each of the first ferromagnetic layer and the second ferromagnetic layer differs for each crystal grain, resulting in that the magnetic interaction between the crystal grains is weakened. For this reason, it is not possible to obtain a film characteristic of a next-generation MRAM of a giga bit level. This has a great influence on variations in perpendicular magnetic property, etc.

BRIEF DESCRIPTION OF THE DRAWINGS

FIG. 31 shows an example of the magnetoresistive effect film used for the magnetic memory according to the sixth embodiment.

FIG. 32 shows an example of the magnetoresistive effect film used for the magnetic memory according to the sixth embodiment.

DETAILED DESCRIPTION

A method of fabricating a magnetic, memory according to an embodiment includes: forming a separation layer on a first substrate; sequentially forming a first ferromagnetic layer, a first nonmagnetic layer, and a second ferromagnetic layer on the separation layer, at least one of the first and the second ferromagnetic layers having a single crystal structure; forming a first conductive bonding layer on the second ferromagnetic layer; forming a second conductive bonding layer on a second substrate, on which a transistor and a wiring are formed, the second conductive bonding layer electrically connecting to the transistor; arranging the first substrate and the second substrate so that the first conductive bonding layer and the second conductive bonding layer are opposed to each other, and bonding the first and the second conductive bonding layers to each other; and separating the first substrate from the first ferromagnetic layer by using the separation layer.

Embodiments will now be explained with reference to the accompanying drawings.

First Embodiment

Figure 1:
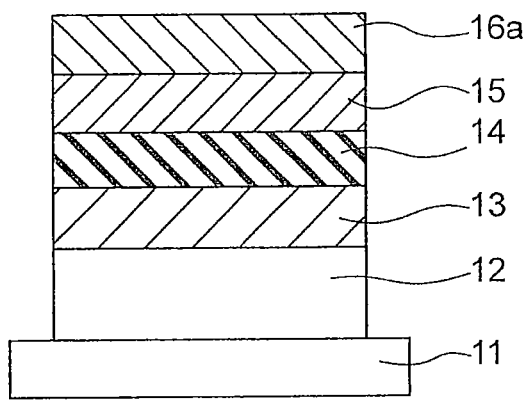
FIG. 1 is a cross-sectional view showing a magnetoresistive effect film fabricated by a fabricating method according to a first embodiment.

A method of fabricating a magnetic memory according to a first embodiment will be explained. The magnetic memory fabricated by the fabricating method according to the first embodiment includes at least one memory cell that has a magnetoresistive effect element serving as a storage element. The magnetoresistive effect element has a magnetoresistive effect film 1, which is shown in FIG. 1. The magnetoresistive effect film 1 is fabricated in such a process that first a single crystal substrate, for example a single crystal substrate 11 of Si, of which the (001) surface is the main surface (hereinafter, also referred to as "Si(001)"), is prepared, and then a detachment layer 12 is formed on the single crystal substrate 11. The detachment layer 12 is used as an example of a separation layer. Subsequently, a first ferromagnetic layer 13 is formed on the detachment layer 12, and a first nonmagnetic layer 14 is formed on the first ferromagnetic layer 13. Thereafter, a second ferromagnetic layer 15 is formed on the first nonmagnetic layer 14, and a conductive bonding layer 16a is formed on the second ferromagnetic layer 15. The aforementioned layers are sequentially formed in vacuum by a sputtering method, molecular beam epitaxy (MBE) method, or electron beam evaporation method. In this manner, at least one of the first and the second ferromagnetic layers 13 and 15 has a single crystal structure.

The single crystal substrate 11 is not limited to a single crystal substrate of Si having the (001) surface as the main surface, but can be a single crystal substrate of at least one material selected from the group consisting of MgO, $Al_2O_3$, $SrTiO_3$, $MgAl_2O_4$, and $TiO_2$, having the (001) surface serving as the main surface. This also applies to the other embodiments and their modifications, which will be described later.

In this embodiment, the single crystal substrate having the (001) surface as the main surface is used. However, it is possible to use a single crystal substrate having a {001} surface that is equivalent to the (001) surface as the main surface. Here, the {001} surface is a comprehensive expression of the Miller index indicating any of (001) surface, (010) surface, (100) surface, (00-1) surface, (0-10) surface, (-100) surface, (002) surface, (020) surface, (200) surface, (00-2) surface, (0-20) surface, (-200) surface, and (00L) surface, where L means an integer. In the following descriptions, a (xyz) surface represents all of the other equivalent surfaces that may be expressed as a {xyz} surface.

To form the detachment layer 12, a fluoride such as LiF, NaF, KF, RbF, and CsF, a chloride such as NaCl, MgCl, CaCl, SrCl, and BaCl, or an oxide such as LiO, NaO, KO, RbO, and CsO can be used. Alternatively, a stacked structure of the fluoride, chloride, and oxide can be used. The fluoride, chloride, and oxide mentioned above have a deliquescent property.

To form the first nonmagnetic layer 14, an insulating material such as MgO, ZnO, MgAlO, $SrTiO_3$, and CaO, and the stacked structure including these materials can be used. For example, a stacked structure such as MgO/ZnO, MgO/ZnO/MgO, MgAlO/MgO, and $SrTiO_3$/MgO can be used.

At least one of the first ferromagnetic layer 13 and the second ferromagnetic layer 15 is a magnetic layer including at least one element selected from the group consisting of Mn, Ga, and Al, and having an axis of easy magnetization in a direction perpendicular to a film plane. A first example is an alloy of Mn and Al. Since a MnAl alloy is formed of light elements, the Gilbert damping factor is low. Accordingly, the energy required for magnetization switching is low, resulting in that it is possible to considerably reduce the current density for switching magnetization by means of spin-polarized electrons. Furthermore, since a MnAl alloy has an energy gap in the [001] direction with respect to either of the up-spin or down-spin band, it has a half metallic characteristic and a high spin polarization, resulting in that it is possible to obtain a high magnetoresistive ratio.

A second example is a magnetic layer containing Mn and Ga. If both of the first ferromagnetic layer 13 and the second ferromagnetic layer 15 are formed of a MnGa alloy, the coercive force of the first ferromagnetic layer 13 is differentiated from that of the second ferromagnetic layer 15 by differentiating the composition ratio of Mn of the first ferromagnetic layer 13 from that of the second ferromagnetic layer 15. Furthermore, it is possible to stack an alloy containing Mn and Al and an alloy containing Mn and Ga. Examples of the stacking are MnGa/MnAl, MnGa/MnAl/MnGa, and the like.

A third example is a magnetic layer that does not include at least one element selected from the group consisting of Mn, Ga, and Al. For example, the third example is an alloy containing at least one element selected from the group consisting of Fe, Co, and Ni, and at least one element selected from the group consisting of Cr, Pt, Pd, Ir, Rh, Ru, Os, Re, Au, and Cu. For example, FePt, FePd, CoPt and the like, correspond to the third example.

A fourth example is a magnetic layer containing at least one element selected from the group consisting of Fe, Co, and Ni and at least one element selected from the group consisting of Tb, Dy, Sm, Eu, and Tm. For example, $TbFe_2$, $SmFe_2$, $EuFe_2$, and the like correspond to the fourth example.

The conductive bonding layer 16a is formed of at least one metal selected from the group consisting of Au, Cu, Pt, Ag, Al, Ta, Ti, W, Cr, Mo, V, Nb, Zr, Hf, Mg, and Ru, or an alloy containing at least one of the aforementioned metals, or a nitride, boride, oxide, or carbide of at least one of the aforementioned metals. The conductive bonding layer 16a serves as a cap layer of the magnetoresistive effect element. The thickness of the conductive bonding layer 16a is 0.1 nm-100 nm, but it is preferable that the thickness be 20 nm or less.

In order to obtain a high magnetoresistive ratio, a magnetic layer can be inserted to an interface between the first nonmagnetic layer 14 and the first ferromagnetic layer 13 or second ferromagnetic layer 15, the magnetic layer containing at least one element selected from the group consisting of Fe, Co, and Ni, which are elements having a high spin polarization, or containing at least one element selected from the group consisting of Fe, Co, Ni and at least one element selected from the group consisting of B, C, N, Al, Si, P, Ta, W, and Mo. Furthermore, it is possible to use a stacked structure containing layers of such elements. Examples of such elements are CoFe/MnGa, Co/MnGa, Fe/MnGa, CoFeB/MnGa, CoFeTa/MnGa, CoFeSi/MnGa, $CoFe/TbFe_2$, $CoFe/SmFe_2$, $CoFe/EuFe_2$ and the like.

(First and Second Modifications)

Figure 2:
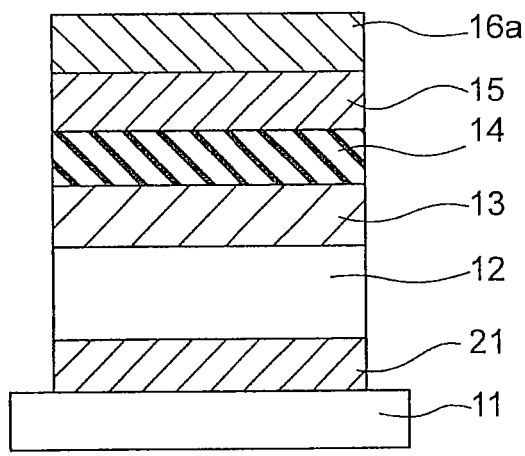
FIG. 2 is a cross-sectional view showing a magnetoresistive effect film fabricated by a first modification of the first embodiment.

FIG. 2 shows a magnetoresistive effect film 1A fabricated by a first modification of the fabricating method according to the first embodiment. The magnetoresistive effect film 1A has a structure in which a base layer 21 is formed between the detachment layer 12 and the substrate 11 in the magnetoresistive effect film 1 shown in FIG. 1 in order to reduce the lattice mismatch.

Figure 3:
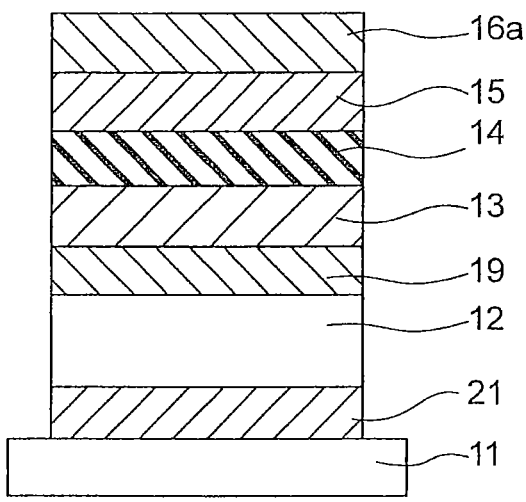
FIG. 3 is a cross-sectional view showing a magnetoresistive effect film fabricated by a second modification of the first embodiment.

FIG. 3 shows a magnetoresistive effect film 1B fabricated by a second modification of the fabricating method according to the first embodiment. The magnetoresistive effect film 1B has a structure in which a base layer 21 is formed between the detachment layer 12 and the substrate 11 in order to reduce the lattice mismatch, and a lattice relaxation layer 19 is formed between the detachment layer 12 and the first ferromagnetic layer 13 in the magnetoresistive effect film 1 shown in FIG. 1.

A first example of the lattice relaxation layer 19 is a nitride layer having a (001)-oriented NaCl structure, and containing at least one element selected from the group consisting of Ti, Zr, Nb, V, Hf, Ta, Mo, W, B, Al, and Ce.

A second example of the lattice relaxation layer 19 is a single layer of (002)-oriented perovskite conductive oxide expressed by $ABO_3$. The A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb.

A third example of the lattice relaxation layer 19 is an oxide layer having a (001)-oriented NaCl structure, and containing at least one element selected from the group consisting of Mg, Al, and Ce.

A fourth example of the lattice relaxation layer 19 is a layer having a (001)-oriented tetragonal structure or cubic structure, and containing at least one element selected from the group consisting of Al, Cr, Fe, Co, Rh, Pd, Ag, Ir, Pt, and Au.

A material of the base layer 21 can be the same as that of the lattice relaxation layer 19. That is to say, a first example of the base layer 21 is a nitride layer having a (001)-oriented NaCl structure, and containing at least one element selected from the group consisting of Ti, Zr, Nb, V, Hf, Ta, Mo, W, B, Al, and Ce.

A second example of the base layer 21 is a single layer of (002)-oriented perovskite conductive oxide represented by $ABO_3$. The A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Jr, Ta, Ce, and Pb.

A third example of the base layer 21 is an oxide layer having a (001)-oriented NaCl structure, and containing at least one element selected from the group consisting of Mg, Al, and Ce.

A fourth example of the base layer 21 is a layer having a (001)-oriented tetragonal structure or cubic structure, and containing at least one element selected from the group consisting of Al, Cr, Fe, Co, Rh, Pd, Ag, Jr, Pt, and Au. Incidentally, both of a conductive material and an insulating material can be used as the material of the lattice relaxation layer 19 and the base layer 21.

(Third Modification)

Figure 4:
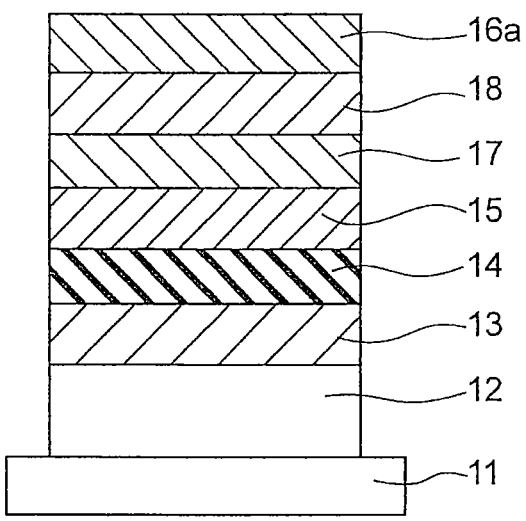
FIG. 4 is a cross-sectional view showing a magnetoresistive effect film fabricated by a third modification of the first embodiment.

FIG. 4 shows a magnetoresistive effect film 1C fabricated by a third modification of the fabricating method according to the first embodiment. The magnetoresistive effect film 1C has a structure in which a second nonmagnetic layer 17 and a third ferromagnetic layer 18 are formed in this order between the second ferromagnetic layer 15 and the conductive bonding layer 16a of the magnetoresistive effect film 1 shown in FIG. 1.

In the magnetoresistive effect film 1C fabricated by the third modification, the first ferromagnetic layer 13 is a storage layer (free layer), in which the direction of magnetization is changeable, and the second ferromagnetic layer 15 is a reference layer (fixed layer), in which the direction of magnetization is fixed. The meaning of the feature that the direction of magnetization of the first ferromagnetic layer 13 is "changeable" is that the direction of magnetization of the first ferromagnetic layer 13 can be changed between before and after a write current flows between the first ferromagnetic layer 13 and the second ferromagnetic layer 15 through the first nonmagnetic layer 14. Furthermore, the meaning of the feature that the direction of magnetization of the second ferromagnetic layer 15 is "fixed" is that the direction of magnetization of the second ferromagnetic layer 15 is not changed between before and after a write current flows between the first ferromagnetic layer 13 and the second ferromagnetic layer 15 through the first nonmagnetic layer 14.

The third ferromagnetic layer 18 is also called "shift adjustment layer," and has a magnetization that is antiparallel (opposite direction) to the direction of magnetization of the second ferromagnetic layer 15. The third ferromagnetic layer 18 can be coupled with the second ferromagnetic layer 15 via the second nonmagnetic layer 17 by synthetic anti-ferromagnetic coupling. In this manner, it is possible to reduce and adjust the shift of the switching current of the first ferromagnetic layer 13 to serve as a storage layer caused by the magnetic stray field from the second ferromagnetic layer 15 to serve as the reference layer.

It is desirable that the second nonmagnetic layer 17 should have a heat resistance so that the second ferromagnetic layer 15 and the third ferromagnetic layer 18 are not mixed with each other in a heating process, and a function of controlling crystalline orientation in forming the third ferromagnetic layer 18. Furthermore, if the thickness of the second nonmagnetic layer 17 is increased, the distance between the third ferromagnetic layer 18 and the storage layer 13 is increased. As a result, the shift adjustment magnetic field applied from the third ferromagnetic layer 18 to the storage layer 13 is decreased. Therefore, it is desirable that the thickness of the second nonmagnetic layer 17 be 5 nm or less.

The third ferromagnetic layer 18 is formed of a ferromagnetic material with an axis of easy magnetization in a direction perpendicular to a film plane. Since the third ferromagnetic layer 18 is more distant from the storage layer 13 than the reference layer 15, in order to adjust the magnetic stray field to be applied to the storage layer 13 by means of the third ferromagnetic layer 18, it is necessary to set the thickness of the third ferromagnetic layer 18 or the magnitude of the saturation magnetization $M_s$ than those of the reference layer 15. That is to say, it is necessary to meet the following relational expression wherein the thickness and the saturation magnetization of the reference layer 15 are $t_2$ and $M_{s2}$, respectively, and the thickness and the saturation magnetization of the third ferromagnetic layer 18 (shift adjustment layer) are $t_3$ and $M_{s3}$, respectively.

$$M_{s2} \times t_2 < M_{s3} \times t_3$$

(Fourth and Fifth Modifications)

Figure 5:
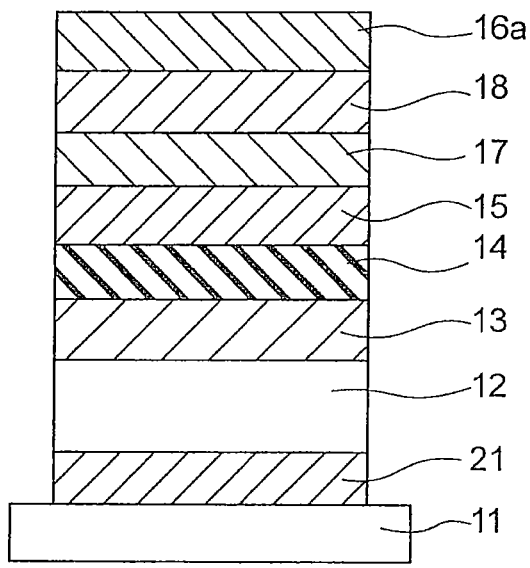
FIG. 5 is a cross-sectional view showing a magnetoresistive effect film fabricated by a fourth modification of the first embodiment.

FIG. 5 shows a magnetoresistive effect film 1D fabricated by a fourth modification of the fabricating method according to the first embodiment. As shown in FIG. 5, the magnetoresistive effect film 1D of the fourth modification has a structure in which a base layer 21 is formed between the detachment layer 12 and the substrate 11 in the third modification in order to reduce the lattice mismatch.

Figure 6:
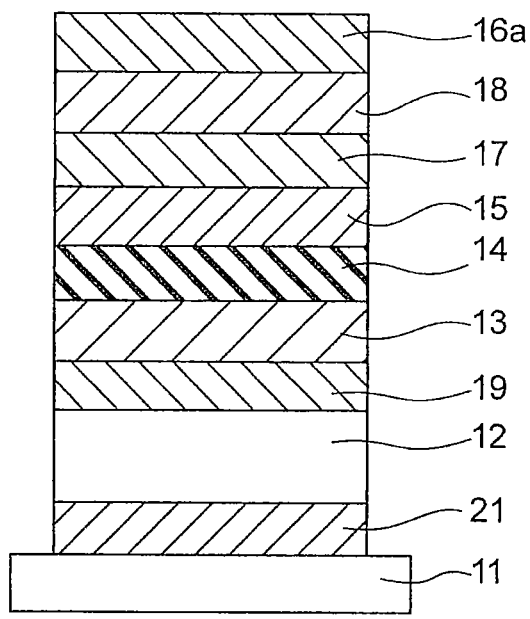
FIG. 6 is a cross-sectional view showing a magnetoresistive effect film fabricated by a fifth modification of the first embodiment.

Furthermore, FIG. 6 shows a magnetoresistive effect film 1E fabricated by a fifth modification the fabricating method according to the first embodiment. As shown in FIG. 6, the magnetoresistive effect film 1E of the fifth modification has a structure in which a base layer 21 is formed between the detachment layer 12 and the substrate 11 in order to reduce the lattice mismatch, and a lattice relaxation layer 19 is formed between the detachment layer 12 and the first ferromagnetic layer 13 in the third modification.

(Sixth Modification)

Figure 7:
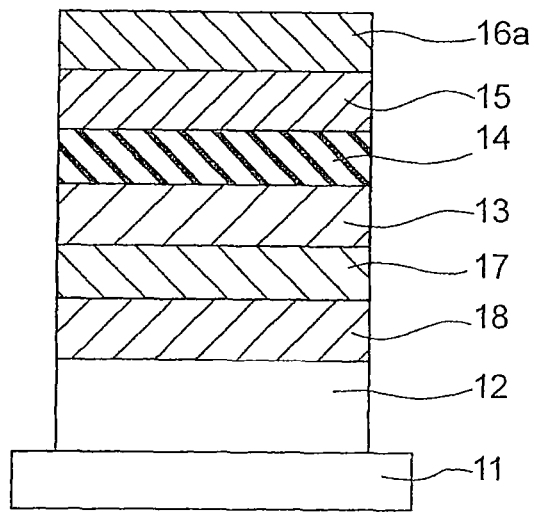
FIG. 7 is a cross-sectional view showing a magnetoresistive effect film fabricated by a sixth modification of the first embodiment.

FIG. 7 shows a magnetoresistive effect film 1F fabricated by a sixth modification of the fabricating method according to the first embodiment. The magnetoresistive effect film 1F has a structure in which a third ferromagnetic layer 18 and a second nonmagnetic layer 17 are formed in this order between the detachment layer 12 and the first ferromagnetic layer 13 in the magnetoresistive effect film 1 shown in FIG. 1. In the magnetoresistive effect element 1F fabricated by the sixth modification, the first ferromagnetic layer 13 serves as a reference layer, in which the direction of magnetization is fixed, and the second ferromagnetic layer 15 serves as a storage layer, in which the direction of magnetization is changeable. The third ferromagnetic layer 18 may be coupled with the first ferromagnetic layer 13 via the second nonmagnetic layer 17 by synthetic anti-ferromagnetic coupling. In this manner, it is possible to reduce and adjust the shift of switching current of the second ferromagnetic layer 15 to serve as a storage layer caused by the magnetic stray field from the first ferromagnetic layer 13 to serve as a reference layer.

It is desirable that in the sixth modification, the second nonmagnetic layer 17 should have a heat resistance so that the first ferromagnetic layer 13 and the third ferromagnetic layer 18 are not mixed with each other in a heating process, and a function of controlling crystalline orientation in forming the third ferromagnetic layer 18. Furthermore, if the thickness of the second nonmagnetic layer 17 is increased, the distance between the third ferromagnetic layer 18 and the storage layer 15 is increased. Accordingly, the shift adjustment magnetic field applied from the third ferromagnetic layer 18 to the storage layer 15 is decreased. Therefore, it is desirable that the thickness of the second nonmagnetic layer 17 be 5 nm or less.

(Seventh and Eighth Modifications)

Figure 8:
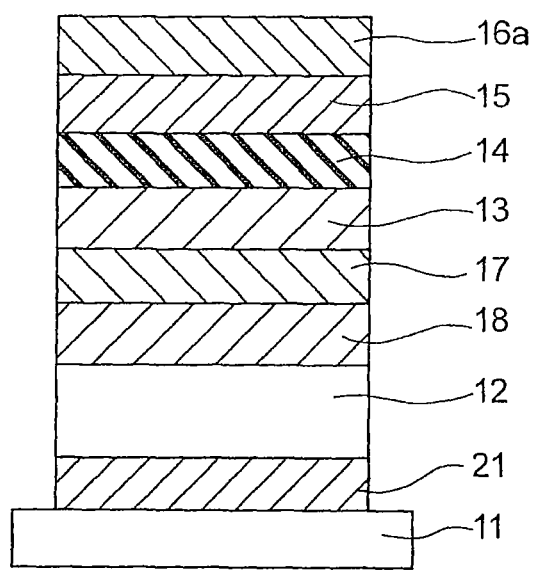
FIG. 8 is a cross-sectional view of a magnetoresistive effect film fabricated by a seventh modification of the first embodiment.

FIG. 8 shows a magnetoresistive effect film 1G fabricated by a seventh modification of the fabricating method according to the first embodiment. As shown in FIG. 8, the magnetoresistive effect film 1G of the seventh modification has a structure in which a base layer 21 is formed between the detachment layer 12 and the substrate 11 in the sixth modification in order to reduce the lattice mismatch.

Figure 9:
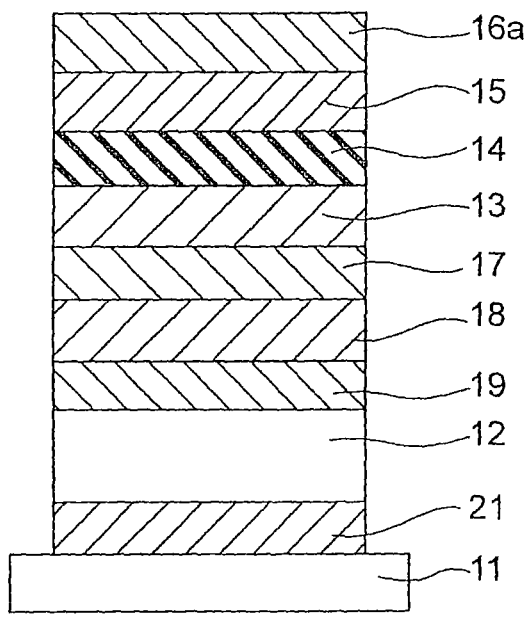
FIG. 9 is a cross-sectional view of a magnetoresistive effect film fabricated by an eighth modification of the first embodiment.

FIG. 9 shows a magnetoresistive effect film 1H fabricated by an eighth modification of the fabricating method according to the first embodiment. As shown in FIG. 9, the magnetoresistive effect film 1H of the eighth modification has a structure in which a base layer 21 is formed between the detachment layer 12 and the substrate 11 in order to reduce the lattice mismatch, and a lattice relaxation layer 19 is formed between the detachment layer 12 and the third ferromagnetic layer 18 in the sixth modification.

EXAMPLES

Next, an example of the method of fabricating a magnetic memory according to the first embodiment will be explained. The magnetic memory fabricated by the fabricating method of this example includes a magnetoresistive effect element as a storage element, which magnetoresistive effect element has the magnetoresistive effect film 1B shown in FIG. 3.

A Si(001) single crystal substrate 11 having a diameter of 300 mm, to which a number of holes are made by a known TSV (Through Silicon Via) technique, is prepared in advance. On the single crystal substrate 11, a base layer 21 of $SrRuO_3$ is formed in vacuum by a sputtering method or MBE method. On the base layer 21, a detachment layer 12 of LiF is formed in vacuum by a sputtering method or MBE method. On the detachment layer 12, a lattice relaxation layer 19 of SrRuO$_3$ is formed in vacuum by a sputtering method or MBE method. On the lattice relaxation layer 19, a first ferromagnetic layer 13 of MnGa is formed in vacuum by a sputtering method or MBE method. On the first ferromagnetic layer 13, a first nonmagnetic layer 14 of MgO is formed in vacuum by a sputtering method or MBE method.

On the first nonmagnetic layer 14, a second ferromagnetic layer 15 of MnGa is formed in vacuum by a sputtering method or MBE method. On the second ferromagnetic layer 15, a conductive bonding layer 16a of Ta with a thickness of, for example, 10 nm, is formed in vacuum by a sputtering method or MBE method (FIG. 3). In this manner, the magnetoresistive effect element 1B including a ferromagnetic layer with a single crystal structure is formed by sequentially forming layers in vacuum by a sputtering method or MBE method.

Figure 10:
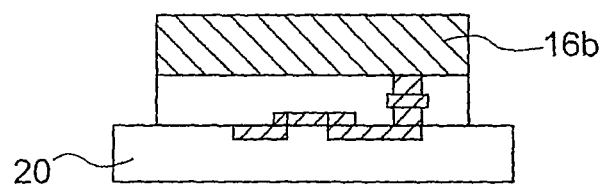
FIG. 10 is a cross-sectional view for explaining the fabricating method according to the first embodiment.

Then, as shown in FIG. 10, a substrate 20 having a diameter of 300 mm, on which a transistor and a wiring are formed, is prepared. On the substrate 20, a conductive bonding layer 16b of Ta with a thickness of 10 nm is formed by a sputtering method. The conductive bonding layer 16b is electrically connected to the substrate 20, on which the transistor is formed.

It is desirable that the surface roughness of the conductive bonding layers 16a, 16b thus formed is 1 nm or less. If the surface roughness is more than 1 nm, it is necessary to smoothen the surface by CMP (Chemical Mechanical Polishing), GCIB (Gas Cluster Ion Beam), etc.

Figure 11:
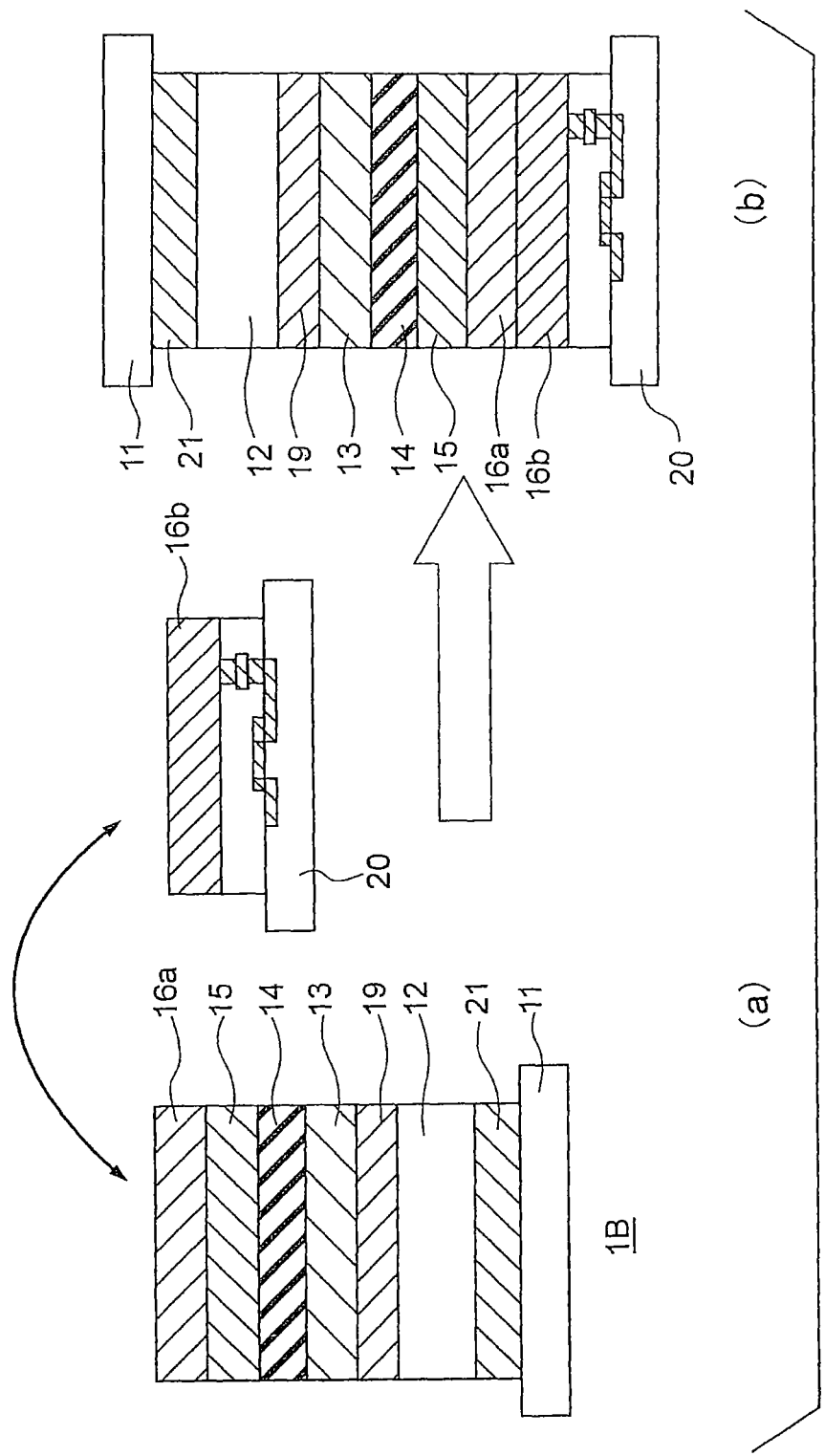
FIGS. 11(a) and 11(b) are cross-sectional views for explaining the fabricating method according to the first embodiment.

Subsequently, the conductive bonding layer 16b of the substrate 20 shown in FIG. 10, on which the transistor and the wiring are formed, is bonded to the metal bonding layer 16a of the substrate 11 shown in FIG. 3, on which the magnetoresistive effect element 1B is formed (FIG. 11(a)). FIG. 11(b) shows the state where the conductive bonding layer 16b is bonded to the conductive bonding layer 16a. The bonding process is performed by first removing oxides and absorption layers attached to the surfaces of the conductive bonding layers 16a, 16b of the two substrates using a Ar ion beam or Ar neutral atom beam, and then applying a pressure loading of 10,000 kgf at an ambient temperature, thereby bonding the two substrate at the conductive bonding layers 16a, 16b.

The bonding strength of the conductive bonding layers 16a, 16b bonded is 10 MPa or more, which is sufficient as a bonding strength. When a material with which it is not possible to obtain a sufficient bonding strength is used to form the conductive bonding layers 16a, 16b, it may be possible to improve the bonding strength by performing the bonding during a heat treatment at a temperature of about 200° C., or performing the bonding at an ambient temperature, and then performing the annealing at a temperature of about 200° C.

Figure 12:
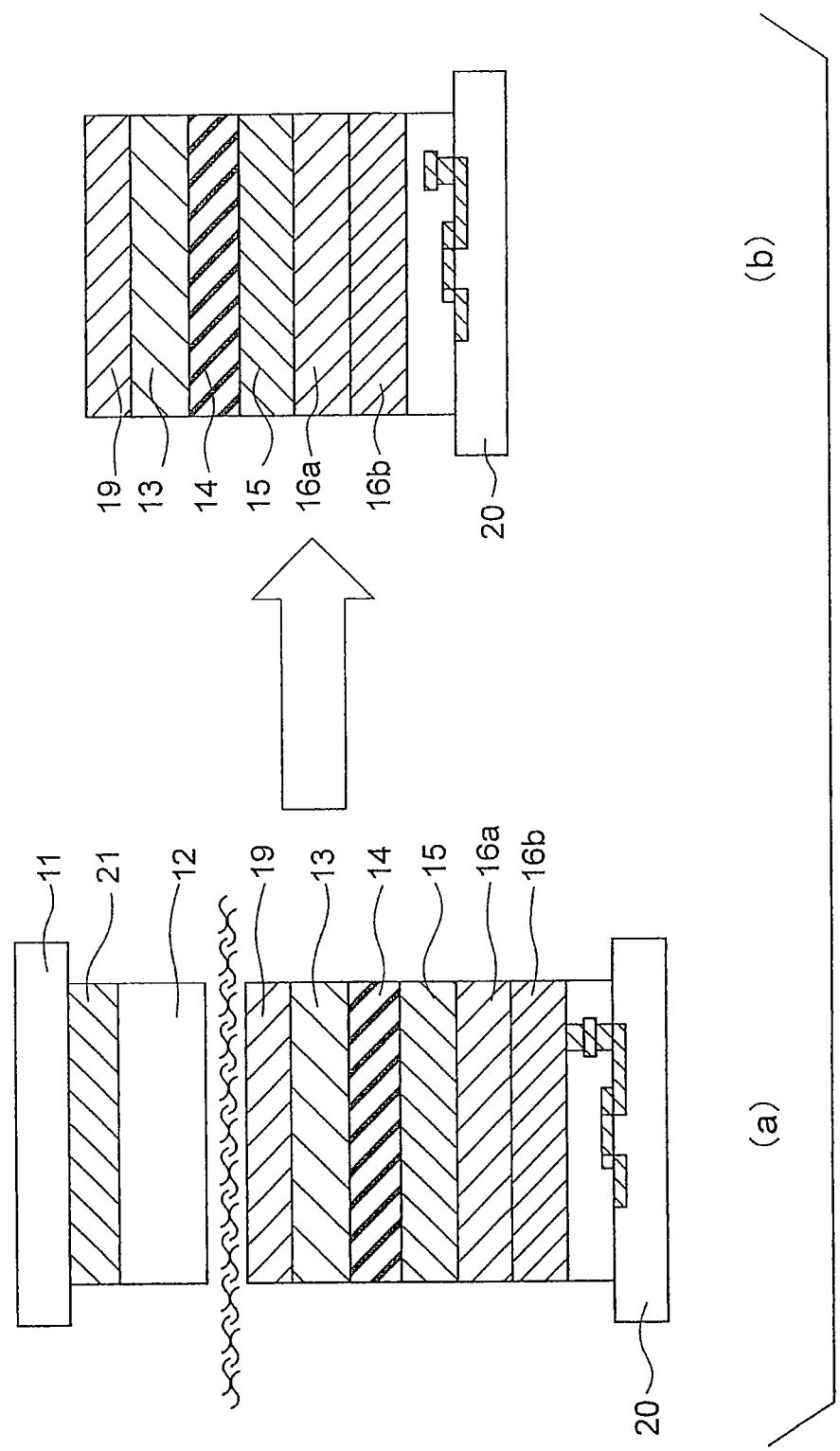
FIGS. 12(a) and 12(b) are cross-sectional views for explaining the fabricating method according to the first embodiment.

Thereafter, as shown in FIG. 12(a), the single crystal substrate 11 is detached. By using such means as a spinner, water jet, etc. in the detachment process, the detachment layer 12 formed of LiF, which has a high deliquescent property, is easily dissolved into water and detached. Incidentally, the solubility of LiF in water is 0.27 g/100 mL (20° C.). Furthermore, as mentioned above, by making holes into the single crystal substrate 11 by means of a TSV technique in advance, the permeability of water into the central portion of the single crystal substrate 11 can be improved, resulting in that the single crystal substrate 11 can be easily detached. After the single crystal substrate 11 is detached, the stacked structure including the lattice relaxation layer 19, the first ferromagnetic layer 13, the first nonmagnetic layer 14, the second ferromagnetic layer 15, and the conductive bonding layer 16a is bonded to the substrate 20, on which the conductive bonding layer 16b is formed.

Incidentally, after the detachment layer 12 is detached, the surface of the lattice relaxation layer 19 on the side of detachment layer 12, which is exposed, may be smoothened by using, for example, CMP, or left exposed without being smoothened. Thereafter, a hard mask layer, which is not shown in the drawings, is formed, and the conductive bonding layers 16b, 16a, the second ferromagnetic layer 15, the first nonmagnetic layer 14, the first ferromagnetic layer 13, the lattice relaxation layer 19, and the hard mask layer are patterned to the shape of the magnetoresistive effect element using a lithographic technique. Subsequently, an interlayer insulating film, which is not shown in the drawings, is formed, the surface of the hard mask layer or the lattice relaxation layer 19 is exposed by using, for example, CMP, and a wiring connecting to the hard mask layer or the lattice relaxation layer 19 is formed, thereby completing the magnetic memory.

As has been explained, it is possible to obtain a magnetoresistive effect element having a structure that on the substrate 20, on which the transistor and the wiring are formed, the conductive bonding layers 16b, 16a, the second ferromagnetic layer 15, the first nonmagnetic layer 14, the first ferromagnetic layer 13, and the hard mask layer or the lattice relaxation layer 19 are formed. In this magnetoresistive effect element, at least one of the first and the second ferromagnetic layers 13, 15 has a single crystal structure, resulting in that the magnetic characteristic of this magnetoresistive effect element is improved as compared with the case where a magnetic body with a polycrystalline structure or amorphous structure is used. Accordingly, if this magnetoresistive effect element is used as a storage element of a magnetic memory, such a magnetic memory would have a large capacity, and would be capable of performing magnetization switching with a low current.

Although the explanation has been made taking the magnetoresistive effect film 1B shown in FIG. 3 as an example, it is also possible to form a magnetoresistive effect element, in which at least one of the first and the second ferromagnetic layers 13, 15 has the single crystal structure, using any of the magnetoresistive effect films 1, 1A, 1C, 1D, 1E, 1F, 1G, 1H shown in FIGS. 1, 2, and 4 to 9. If such a magnetoresistive effect element is used as a storage element of a magnetic memory, the magnetic memory would have a large capacity, and would be capable of performing magnetization switching with a low current.

Second Embodiment

Figure 13:
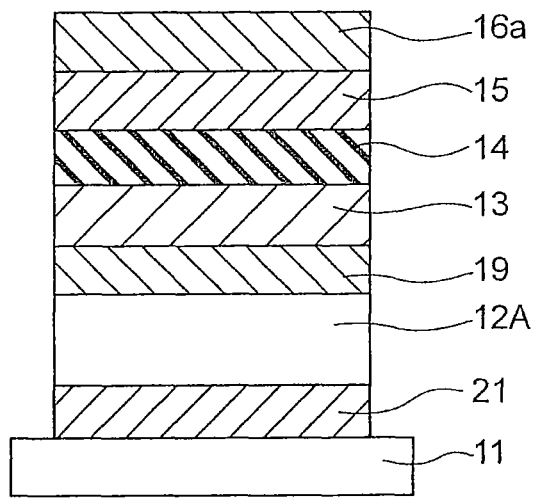
FIG. 13 is a cross-sectional view showing a magnetoresistive effect film fabricated according to the second embodiment.

A method of fabricating a magnetic memory according to a second embodiment will be explained below. The magnetic memory fabricated by the fabricating method according to the second embodiment includes at least one memory cell, which has a magnetoresistive effect element as a storage element. The magnetoresistive effect element has a magnetoresistive effect film. Such a magnetoresistive effect film 1I is shown in FIG. 13. The magnetoresistive effect film 1I is fabricated in a manner that first a single crystal substrate, for example, a Si(001) single crystal substrate 11, is formed, and then a base layer 21 is formed on the single crystal substrate 11. On this base layer 21, a detachment layer 12A is formed in a hydrogen atmosphere. Subsequently, on the detachment layer 12A, a lattice relaxation layer 19 is formed. On the lattice relaxation layer 19, a first ferromagnetic layer 13 is formed, and on the first ferromagnetic layer 13, a first nonmagnetic layer 14 is formed. Thereafter, on the first nonmagnetic layer 14, a second ferromagnetic layer 15 is formed, and on the second ferromagnetic layer 15, a conductive bonding layer 16a is formed. The formation of the aforementioned layers is performed by a sputtering method or MBE method, and except for the formation of the detachment layer 12A, performed in vacuum. In this manner, the first and the second ferromagnetic layers 13, 15 have a single crystal structure.

A first example of the material of the detachment layer 12A used in the fabricating method according to the second embodiment is a hydrogen absorbing alloy expressed by a chemical formula $AB_2$. The A-site is occupied by at least one element selected from the group consisting of Ti, Zr, and Hf, and the B-site is occupied by at least one element selected from the group consisting of the transition metals Mn, Ni, Cr, V, Fe, Ti, Zr, Sc, V, Co, Cu, Zn, Nb, Mo, Ru, Rh, Pd, and Ag.

A second example of the material of the detachment layer 12A is a hydrogen absorbing alloy expressed by a chemical formula $AB_5$. The hydrogen absorbing alloy is formed by combining an element A that forms a hydrogen compound with a metallic element B that does not form a hydrogen compound. The A-site is occupied by at least one rare earth element selected from the group consisting of Y, La, Ce, Pr, and Nd, and the B-site is occupied by at least one transition element selected from the group consisting of Ni, Co, and Al, which has a catalytic effect. For example, the material of the detachment layer 12 of the second example may be $LaNi_5$, $ReNi_5$, and the like.

A third example of the material of the detachment layer 12A is a V-based body centered cubic hydrogen absorbing alloy, which has a relatively large number of voids.

A fourth example of the material of the detachment layer 12A is a hydrogen absorbing alloy containing Mg ($MgNi_2$).

A fifth example of the material of the detachment layer 12A is a hydrogen absorbing alloy containing Ca and at least one element selected from the group consisting of Ni, Ti, Mn, Zr, Sc, V, Cr, Fe, Co, Cu, Zn, Nb, Mo, Ru, Rh, Pd, and Ag.

A sixth example of the material of the detachment layer 12A is a hydrogen absorbing alloy containing at least one element selected from the group consisting of Pd and Pt.

A seventh example of the material of the detachment layer 12A is a conductive oxide material with a perovskite structure. If a perovskite oxide is expressed by $ABO_3$, the A-site is occupied by at least one element selected from the group consisting of Sr, Ce, Dr, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb.

An eighth example of the material of the detachment layer 12A is a helium absorbing alloy containing Fe.

(First Modification)

Figure 14:
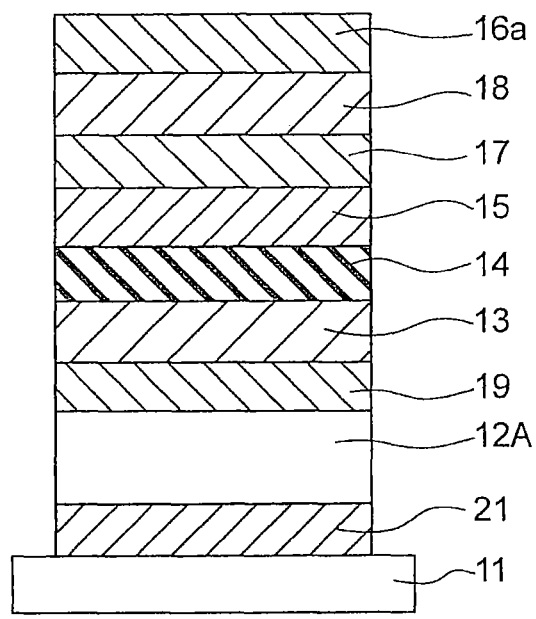
FIG. 14 is a cross-sectional view of a magnetoresistive effect film fabricated by a first modification of the second embodiment.

FIG. 14 shows a magnetoresistive effect film 13 fabricated by a first modification of the fabricating method according to the second embodiment. The magnetoresistive effect film 13 has a structure in which a second nonmagnetic layer 17 and a third ferromagnetic layer 18 are formed in this order between the second ferromagnetic layer 15 and the conductive bonding layer 16a in the magnetoresistive effect film 1I shown in FIG. 13.

In the magnetoresistive effect film 13 fabricated by the first modification, the first ferromagnetic layer 13 serves as a storage layer (free layer), in which the direction of magnetization is changeable, and the second ferromagnetic layer 15 serves as a reference layer (fixed layer), in which the direction of magnetization is fixed. The third ferromagnetic layer 18 is also called "shift adjustment layer," and has a magnetization, the direction of which is antiparallel (opposite direction) to that of the second ferromagnetic layer 15. The third ferro- magnetic layer 18 may be coupled with the second ferromagnetic layer 15 via the second nonmagnetic layer 17 by synthetic anti-ferromagnetic coupling. In this manner, it is possible to reduce and adjust the shift of the switching current of the first ferromagnetic layer 13 to serve as a storage layer caused by a magnetic stray field from the second ferromagnetic layer 15 to serve as a reference layer.

The materials used for the second nonmagnetic layer 17 and the third ferromagnetic layer 18 are those explained in the explanation of the first embodiment.

(Second Modification)

Figure 15:
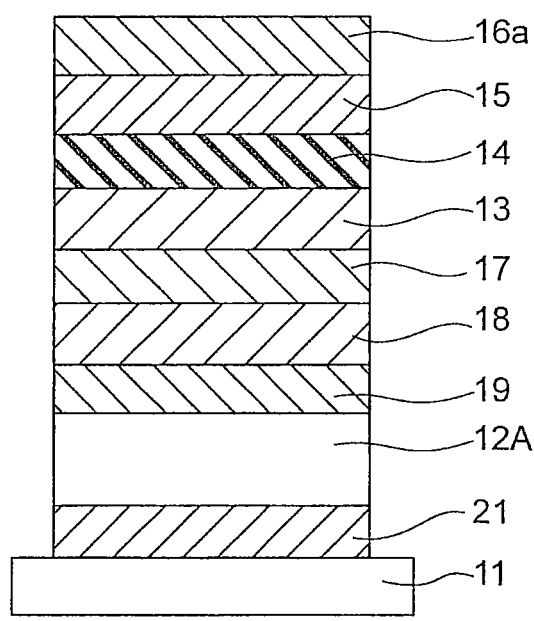
FIG. 15 is a cross-sectional view showing a magnetoresistive effect film fabricated by a second modification of the second embodiment.

FIG. 15 shows a magnetoresistive effect film 1K fabricated by a second modification of the fabricating method according to the second embodiment. The magnetoresistive effect film 1K is obtained by forming a third ferromagnetic layer 18 and a second nonmagnetic layer 17 in this order between the lattice relaxation layer 19 and the first ferromagnetic layer 13 in the magnetoresistive effect film 1I shown in FIG. 13. In the magnetoresistive effect element 1K fabricated by the second modification, the first ferromagnetic layer 13 serves as a reference layer, in which the direction of magnetization is fixed, and the second ferromagnetic layer 15 serves as a storage layer, in which the direction of magnetization is changeable. The third ferromagnetic layer 18 is also called "shift adjustment layer," and has a magnetization, the direction of which is antiparallel (opposite direction) to that of the first ferromagnetic layer 13. The third ferromagnetic layer 18 can be coupled with the first ferromagnetic layer 13 via the second nonmagnetic layer 17 by synthetic anti-ferromagnetic coupling. In this manner, it is possible to reduce and adjust the shift of the switching current of the second ferromagnetic layer 15 to serve as a storage layer caused by the magnetic stray field from the first ferromagnetic layer 13 to serve as a reference layer.

(Example)

Next, an example of the method of fabricating a magnetic memory according to the second embodiment will be explained below. The magnetic memory fabricated by the fabricating method of this example has a magnetoresistive effect element as a storage element, which has a magnetoresistive effect film 1I shown in FIG. 13.

A Si(001) single crystal substrate 11 having a diameter of 300 mm is prepared in advance. On the single crystal substrate 11, a base layer 21 of $SrRuO_3$ is formed in vacuum by a sputtering method or MBE method. On the base layer 21, a detachment layer 12A of $MgNi_2$ is formed in a hydrogen atmosphere by a sputtering method or MBE method. The detachment layer 12A of a hydrogen absorbing alloy thus formed is in a hydrogen embrittlement state. On the detachment layer 12A, a lattice relaxation layer 19 is formed in vacuum by a sputtering method or MBE method. On the lattice relaxation layer 19, a first ferromagnetic layer 13 of MnGa is formed in vacuum by a sputtering method or MBE method. On the first ferromagnetic layer 13, a first nonmagnetic layer 14 of MgO is formed in vacuum by a sputtering method or MBE method. On the first nonmagnetic layer 14, a second ferromagnetic layer 15 of MnGa is formed in vacuum by a sputtering method or MBE method. On the second ferromagnetic layer 15, a conductive bonding layer 16a of Ta with a thickness of, for example, 10 nm is formed in vacuum by a sputtering method or MBE method (FIG. 13). In this manner, the magnetoresistive effect element 1I including a ferromagnetic layer with a single crystal structure is formed by a sputtering method or MBE method.

Next, as shown in FIG. 10, a substrate 20 having a diameter of 300 mm, on which a transistor and a wiring are formed, is prepared. On the substrate 20, a conductive bonding layer 16b of Ta having a thickness of 10 nm is formed by a sputtering method. The conductive bonding layer 16b is electrically connected to the substrate 20, on which the transistor is formed.

It is desirable that the surface roughness of the conductive bonding layers 16a, 16b formed is 1 nm or less. If the surface roughness is more than 1 nm, it is necessary to smoothen the surfaces of these layers by CMP, GCIB, and the like.

Figure 16:
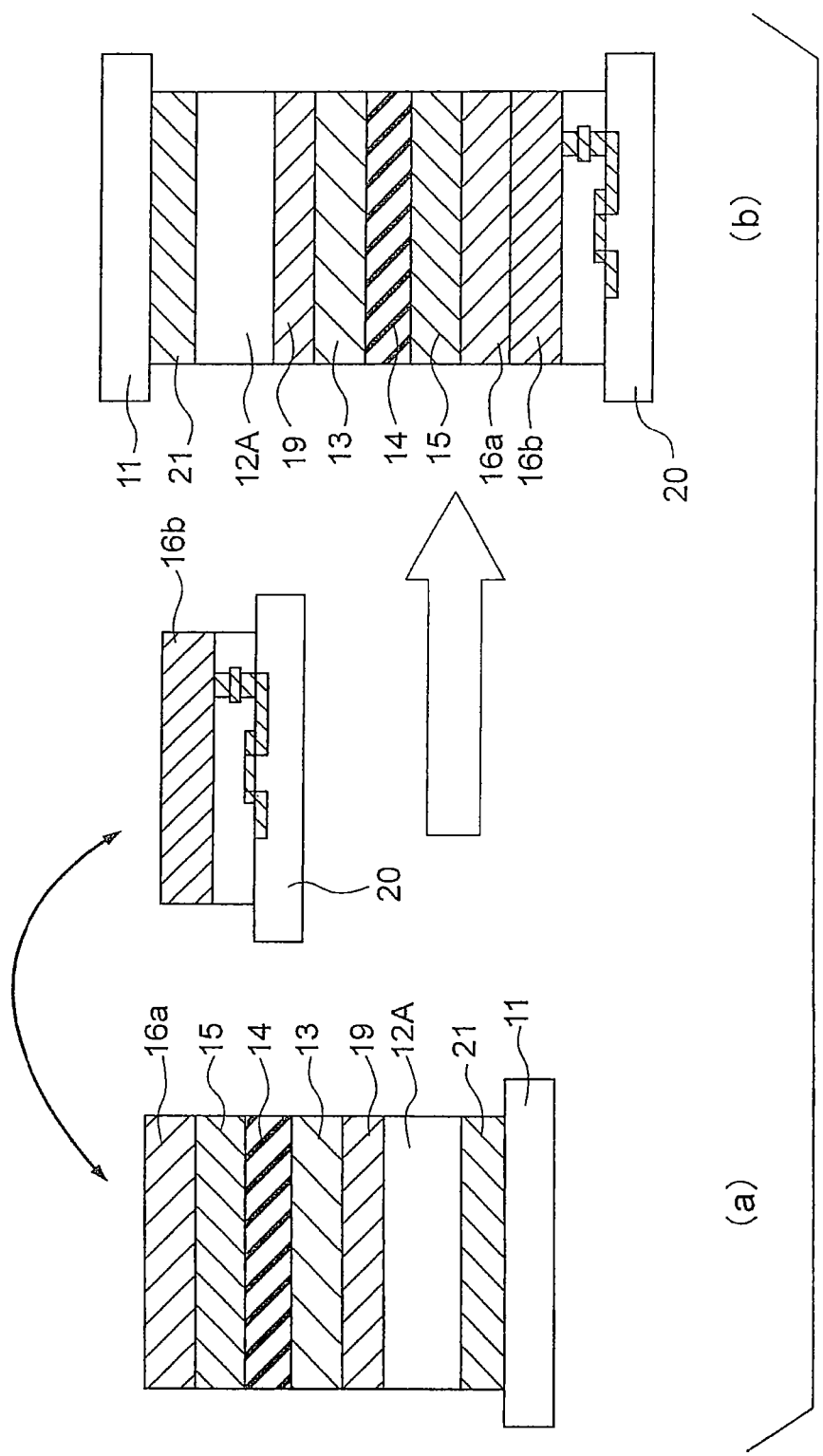
FIGS. 16(a) and 16(b) are cross-sectional views for explaining the fabricating method according to the second embodiment.

Next, the conductive bonding layer 16b of the substrate 20 shown in FIG. 10, on which the transistor and the wiring are formed, is bonded to the conductive bonding layer 16a of the substrate 11 shown in FIG. 13, on which the magnetoresistive effect element if is formed (FIG. 16(a)). FIG. 16(b) shows the state where the conductive bonding layer 16b is bonded to the conductive bonding layer 16a. The bonding process is performed in an atmosphere where the degree of vacuum is $1.0 \times 10^{-6}$ Pa or less by removing oxides and absorption layers on the surfaces of the conductive bonding layers 16a, 16b of the two substrates by using a Ar ion beam or Ar neutral atom beam, and then applying a pressure loading of 10,000 kgf at an ambient temperature, thereby bonding the two substrates at the conductive bonding layers 16a, 16b.

Figure 17:
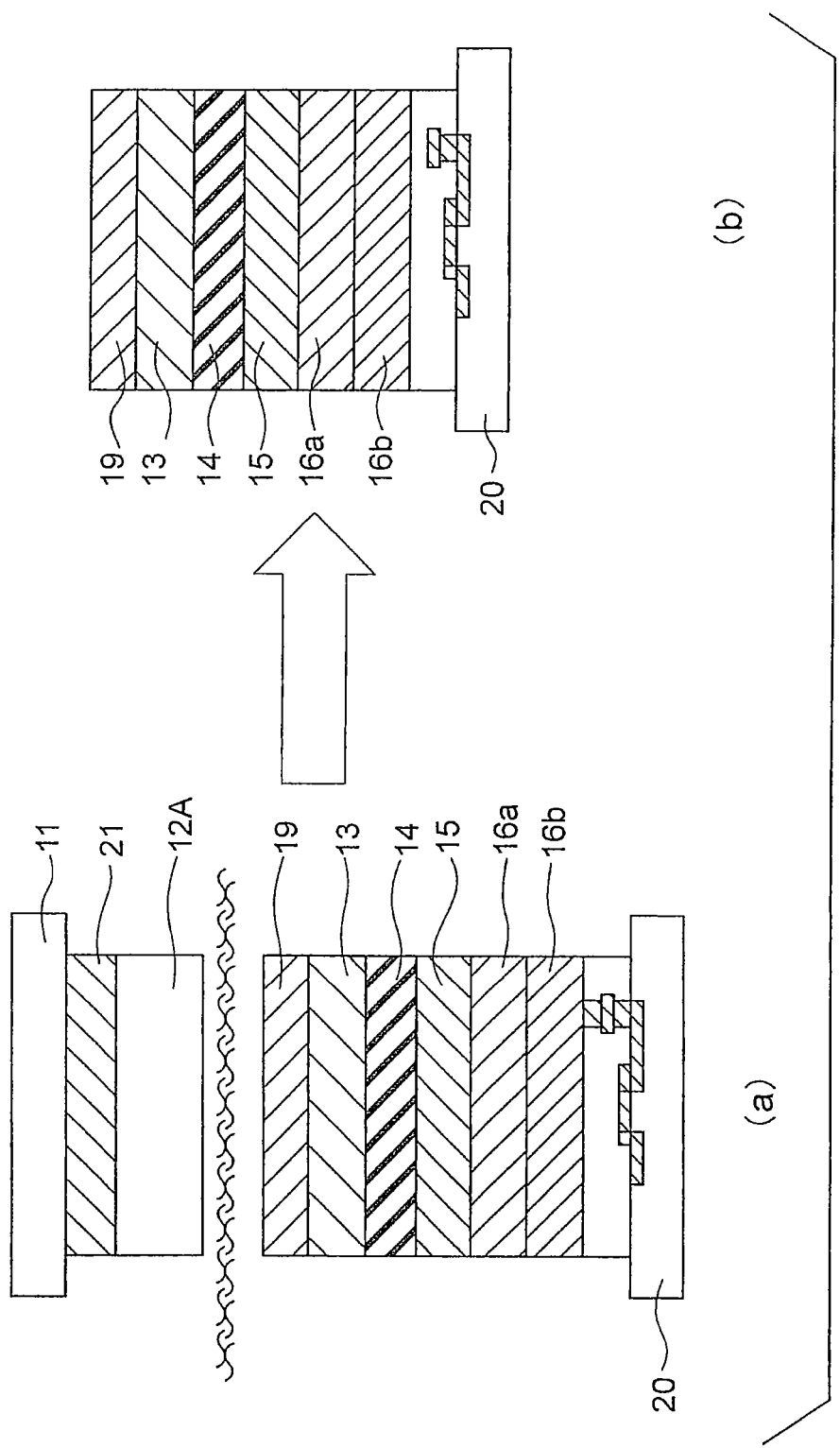
FIGS. 17(a) and 17(b) are cross-sectional views for explaining the fabricating method according to the second embodiment.

Subsequently, as shown in FIG. 17(a), the single crystal substrate 11 is removed. The removal process is performed by a handler device, which holds the respective bonded substrates by suction, and applies forces in right and left or up and down opposite directions, and applies an (slight) impactive force, thereby easily removing the single crystal substrate 11 at the detachment layer 12 in a hydrogen embrittlement state. After the single crystal substrate 11 is removed, the stacked structure including the lattice relaxation layer 19, the first ferromagnetic layer 13, the first nonmagnetic layer 14, the second ferromagnetic layer 15, and the conductive bonding layer 16a is bonded to the substrate 20, on which the conductive bonding layer 16b is formed.

Incidentally, after the detachment layer 12 is detached, the surface of the lattice relaxation layer 19 on the side of detachment layer 12, which is exposed, may be smoothened by using, for example, CMP, or left exposed without being smoothened. Thereafter, a hard mask layer, which is not shown in the drawings, is formed, and the conductive bonding layers 16b, 16a, the second ferromagnetic layer 15, the first nonmagnetic layer 14, the first ferromagnetic layer 13, the lattice relaxation layer 19, and the hard mask layer are patterned to the shape of the magnetoresistive effect element using a lithographic technique. Subsequently, an interlayer insulating film, which is not shown in the drawings, is formed, the surface of the lattice relaxation layer 19 is exposed, and the wiring connecting to the lattice relaxation layer 19 is formed, thereby completing the magnetic memory.

As has been explained, it is possible to obtain a magnetoresistive effect element having a structure that on the substrate 20, on which the transistor and the wiring are formed, the conductive bonding layers 16b, 16a, the second ferromagnetic layer 15, the first nonmagnetic layer 14, the first ferromagnetic layer 13, and the lattice relaxation layer 19 are formed. In this magnetoresistive effect element, the first and the second ferromagnetic layers 13, 15 have a single crystal structure, resulting in that the magnetic characteristic of this magnetoresistive effect element is improved as compared with the case where a magnetic body with a polycrystalline structure or amorphous structure is used. Accordingly, if this magnetoresistive effect element is used as a storage element of a magnetic memory, such a magnetic memory would have a large capacity, and would be capable of performing magnetization switching with a low current.

Although explanation has been made taking the magnetoresistive effect film 1I shown in FIG. 13 as an example, it is possible to form a magnetoresistive effect element, in which the first and the second ferromagnetic layers 13, 15 have the single crystal structure, using any of the magnetoresistive effect films 1J and 1K shown in FIG. 14 and FIG. 15. If such a magnetoresistive effect element is used as a storage element of a magnetic memory, the magnetic memory would have a large capacity, and would be capable of performing magnetization switching with a low current.

Third Embodiment

Figure 18:
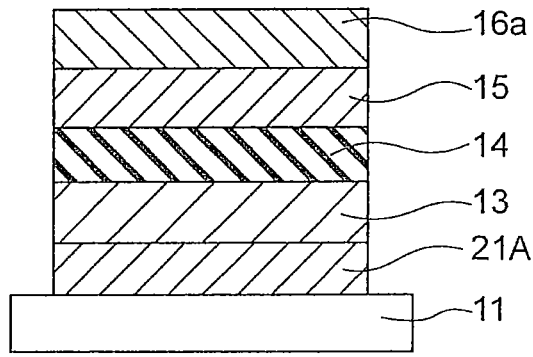
FIG. 18 is a cross-sectional view showing a magnetoresistive effect film fabricated by a fabricating method according to a third embodiment.

A method of fabricating a magnetic memory according to a third embodiment will be explained below. The magnetic memory fabricated according to the third embodiment includes at least one memory cell, which has a magnetoresistive effect element as a storage element. The magnetoresistive effect element has a magnetoresistive effect film. Such a magnetoresistive effect film 1L is shown in FIG. 18. The magnetoresistive effect film 1L is fabricated in such a manner that first a single crystal substrate, for example Si(001) single crystal substrate 11, is prepared, and on the single crystal substrate 11, a base layer 21A is formed. On the base layer 21A, a first ferromagnetic layer 13 is formed in vacuum, and on the first ferromagnetic layer 13, a first nonmagnetic layer 14 is formed. Thereafter, on the first nonmagnetic layer 14, a second ferromagnetic layer 15 is formed, and on the second ferromagnetic layer 15, a conductive bonding layer 16a is formed. The formation of the above layers is sequentially performed in vacuum by a sputtering method or MBE method. In this manner, the first and the second ferromagnetic layers 13, have a single crystal structure.

It is desirable that the material of the base layer 21A should have a high CMP selection ratio with respect to Si in the CMP process described later, so that it works as a CMP stopper. A first example of the material of the base layer 21A is a metal selected from the group consisting of Ta, Cu, Au, Pt, Ag, Al, Ti, W, Nb, and Hf, or an alloy containing at least one of the aforementioned metals. Alternatively, the base layer 21A may have a stacked structure of layers containing such materials.

A second example of the material of the base layer 21A is a perovskite conductive oxide expressed by $ABO_3$. The A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb.

A third example of the material of the base layer 21 is a nitride with a (001)-oriented NaCl structure, containing at least one element selected from the group consisting of Ti, Zr, Nb, V, Hf, Ta, Mo, W, B, Al, and Ce.

(First Modification)

Figure 19:
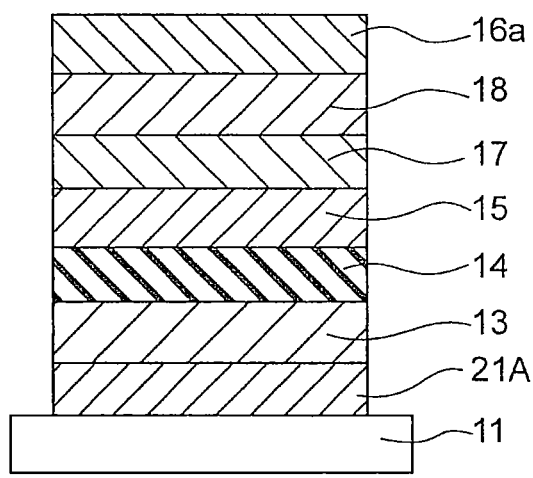
FIG. 19 is a cross-sectional view showing a magnetoresistive effect film fabricated by a first modification of the third embodiment.

FIG. 19 shows a magnetoresistive effect film 1M fabricated by a first modification of the fabricating method according to the third embodiment. The magnetoresistive effect film 1M has a structure in which a second nonmagnetic layer 17 and a third ferromagnetic layer 18 are formed in this order between the second ferromagnetic layer 15 and the conductive bonding layer 16a in the magnetoresistive effect film 1L shown in FIG. 18.

In the magnetoresistive effect film 1M fabricated by the first modification, the first ferromagnetic layer 13 serves as a storage layer (free layer), in which the direction of magnetization is changeable, and the second ferromagnetic layer 15 serves as a reference layer (fixed layer), in which the direction of magnetization is fixed. The third ferromagnetic layer 18 is also called "shift adjustment layer," and has a magnetization that is antiparallel (opposite direction) to that of the second ferromagnetic layer 15. The third ferromagnetic layer 18 may be coupled with the second ferromagnetic layer 15 via the second nonmagnetic layer 17 by synthetic anti-ferromagnetic coupling. In this manner, it is possible to reduce and adjust the shift of the switching current of the first ferromagnetic layer 13 to server as a storage layer caused by the magnetic stray field from the second ferromagnetic layer 15 to serve as a reference layer.

The materials used to form the second nonmagnetic layer 17 and the third ferromagnetic layer 18 are those explained in the explanation of the first embodiment.

(Second Modification)

Figure 20:
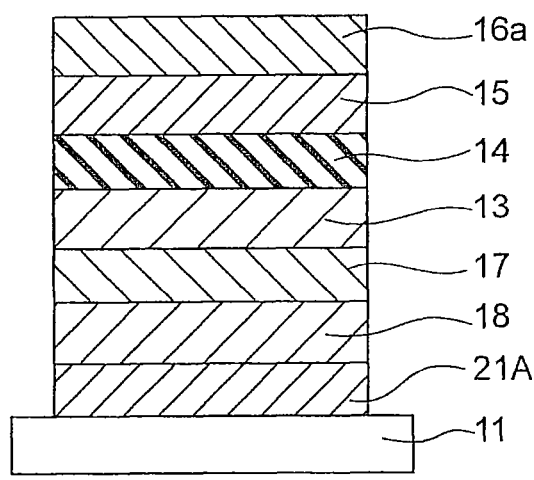
FIG. 20 is a cross-sectional view showing a magnetoresistive effect film fabricated by a second modification of the third embodiment.

FIG. 20 shows a magnetoresistive effect film 1N fabricated by a second modification of the fabricating method according to the third embodiment. The magnetoresistive effect film 1N has a structure in which a third ferromagnetic layer 18 and a second nonmagnetic layer 17 are formed in this order between the lattice relaxation layer 19 and the first ferromagnetic layer 13 in the magnetoresistive effect film 1L shown in FIG. 18. In the magnetoresistive effect element 1N fabricated by the second modification, the first ferromagnetic layer 13 serves as a reference layer, in which the direction of magnetization is fixed, and the second ferromagnetic layer 15 serves as a storage layer, in which the direction of magnetization is changeable. The third ferromagnetic layer 18 is also called "shift adjustment layer," and has a magnetization, the direction of which is antiparallel (opposite direction) to the direction of the magnetization of the first ferromagnetic layer 13. The third ferromagnetic layer 18 may be coupled with the first ferromagnetic layer 13 via the second nonmagnetic layer 17 by synthetic anti-ferromagnetic coupling. In this manner, it is possible to reduce and adjust the shift of the switching current of the second ferromagnetic layer 15 to serve as a storage layer caused by the magnetic stray field from the first ferromagnetic layer 13 to serve as a reference layer.

(Example)

Next, an example of the method of fabricating a magnetic memory according to the third embodiment will be explained below. The magnetic memory fabricated by this example includes a magnetoresistive effect element as a storage element, which has a magnetoresistive effect film 1L shown in FIG. 18.

First, a Si(001) single crystal substrate 11 having a diameter of 300 mm is prepared in advance. It is desirable that this single crystal substrate should have a TTV (Total Thickness Variation) of 1 µm or less in order to improve the in-plane distribution in a BSG (Back Side Grinder) and CMP processes, which will be described later. On the single crystal substrate 11, a base layer 21A of $SrRuO_3$ is formed in vacuum in a sputtering method or MBE method, and on the base layer 21A, a first ferromagnetic layer 13 of MnGa is formed in vacuum by a sputtering method or MBE method. Subsequently, on the first ferromagnetic layer 13, a first nonmagnetic layer 14 of MgO is formed in vacuum by a sputtering method or MBE method, and on the first nonmagnetic layer, a second ferromagnetic layer 15 of MnGa is formed in vacuum by a sputtering method or MBE method.

Thereafter, on the second ferromagnetic layer 15, a conductive bonding layer 16a of Ta having a thickness of, for example, 10 nm, is formed in vacuum by a sputtering method or MBE method (FIG. 18). In this manner, by forming the layers by a sputtering method or MBE method, the magnetoresistive effect element 1I including a ferromagnetic layer with a single crystal structure is formed.

Next, as shown in FIG. 10, a substrate 20 having a diameter of 300 mm, on which a transistor and a wiring are formed, is prepared, and on the substrate 20, a conductive bonding layer 16b of Ta having a thickness of 10 nm is formed by a sputtering method. The conductive bonding layer 16b is electrically connected to the substrate, on which the transistor is formed.

It is desirable that the surface roughness of the conductive bonding layers 16a, 16b thus formed be 1 nm or less. If the surface roughness is more than 1 nm, it is necessary to smoothen the surface by CMP or the like.

Figure 21:
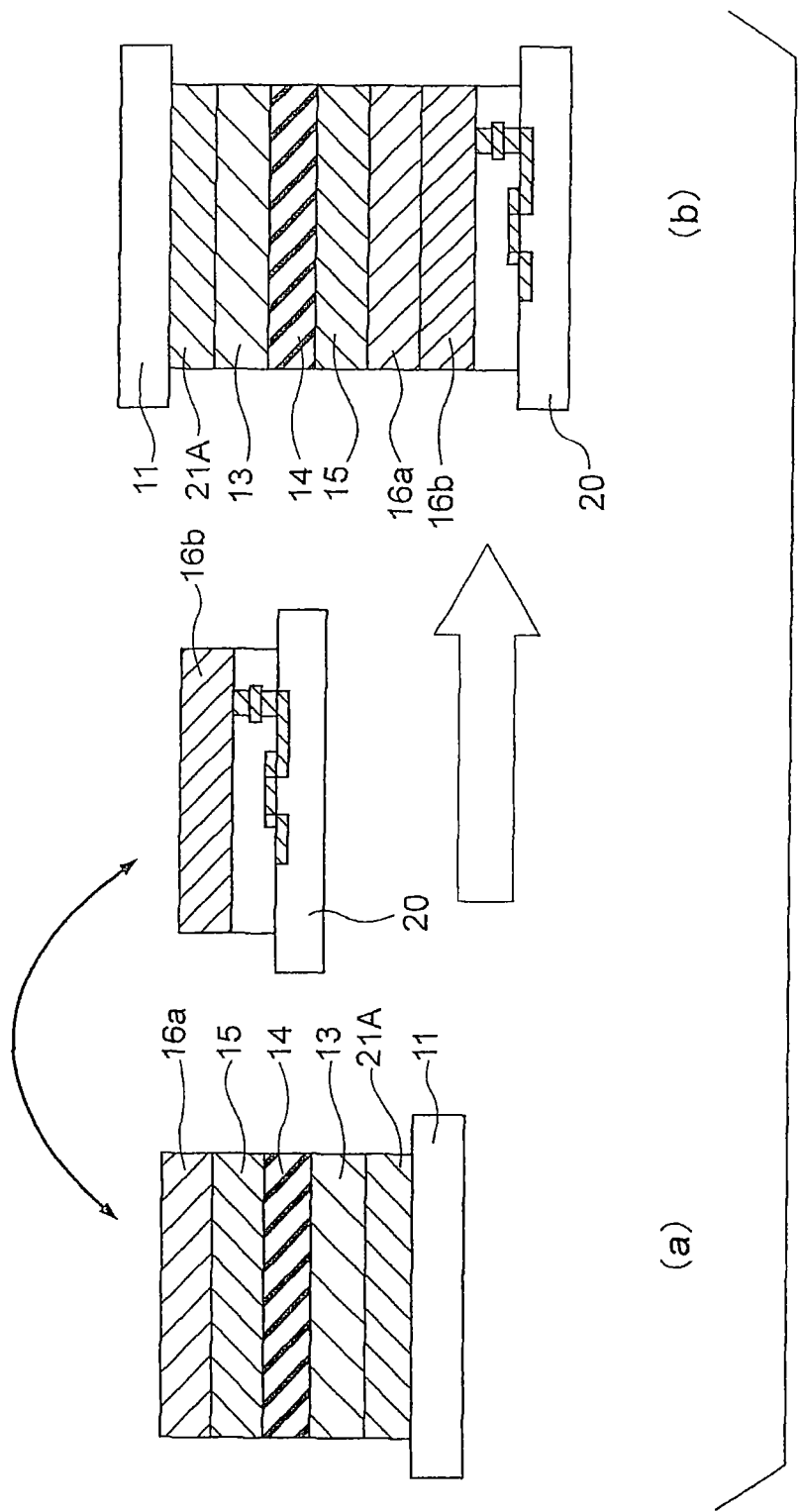
FIGS. 21(a) and 21(b) are cross-sectional views for explaining the fabricating method according to the third embodiment.

Next, the conductive bonding layer 16b on the substrate 20 shown in FIG. 10, on which the transistor and the wiring are formed, is bonded to the conductive bonding layer 16a on the substrate 11 shown in FIG. 18, on which the magnetoresistive effect element 1L is formed (FIG. 21(a)). FIG. 21(b) shows the state where the conductive bonding layer 16b is bonded to the conductive bonding layer 16a. The bonding process is performed in an atmosphere where the degree of vacuum is $1.0 \times 10^{-6}$ Pa or less by removing oxides and absorption layers on the surfaces of the conductive bonding layers 16a, 16b of the two substrates by using a Ar ion beam or Ar neutral atom beam, and then applying a pressure loading of 10,000 kgf at an ambient temperature, thereby bonding the two substrates at the conductive bonding layers 16a, 16b.

Figure 22:
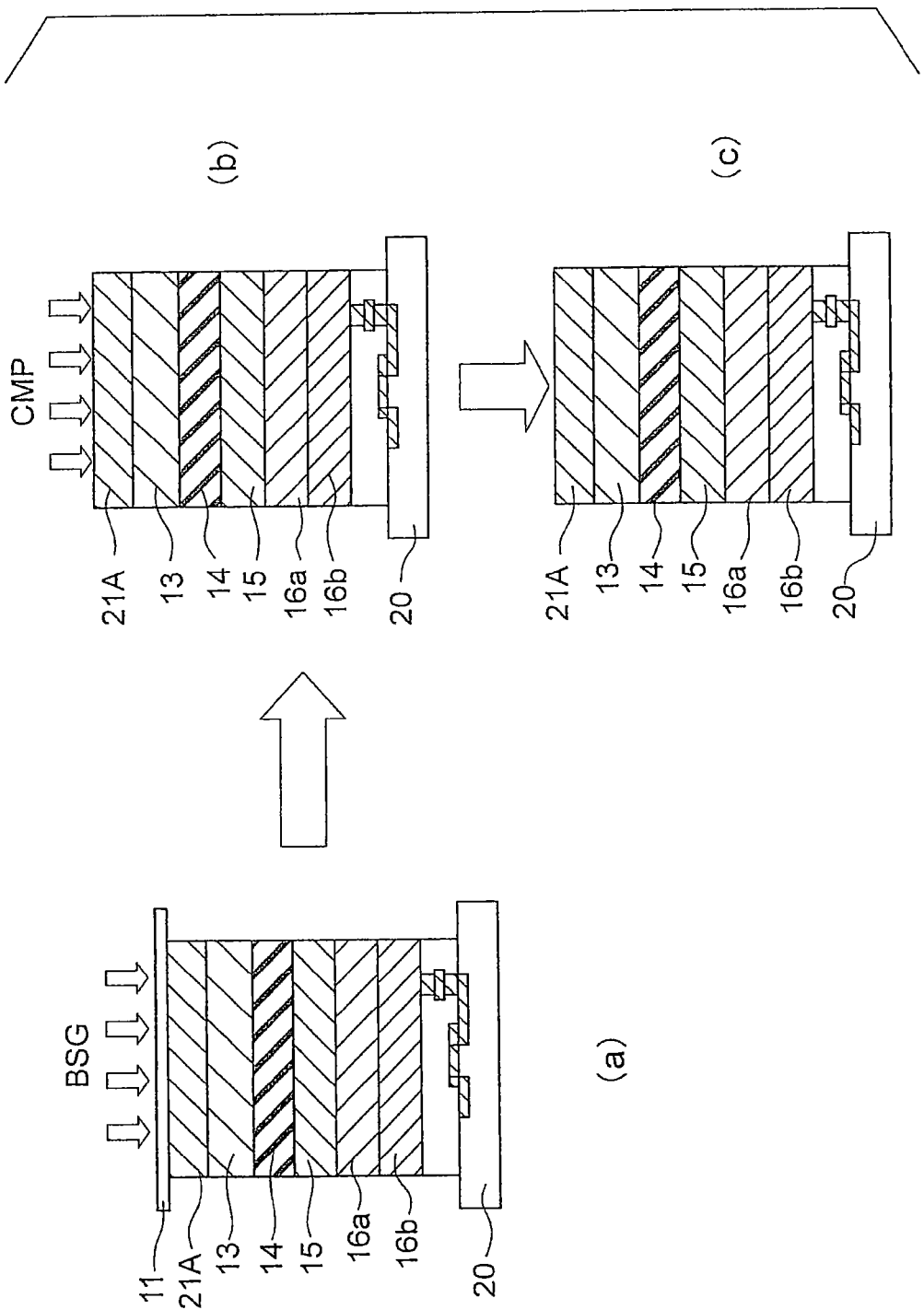
FIGS. 22(a) to 22(c) are cross-sectional views for explaining the fabricating method according to the third embodiment.

Next, as shown in FIGS. 22(a) and 22(b), the single crystal substrate 11 is removed. The removal process is performed by first the single crystal Si substrate 11 side is polished by BSG so that the thickness of the single crystal Si substrate 11 becomes 100 µm (FIG. 22(a)). Thereafter the single crystal Si substrate 11 having the thickness of 100 µm is polished by CMP using the base layer 21A as a stopper layer (22(b)). After the single crystal substrate 11 is removed, the stacked structure including the base layer 21A, the first ferromagnetic layer 13, the first nonmagnetic layer 14, the second ferromagnetic layer 15, and the conductive bonding layer 16a is bonded to the substrate 20, on which the conductive bonding layer 16b is formed.

Thereafter, a hard mask layer, which is not shown in the drawings, is formed, and the conductive bonding layers 16b, 16a, the second ferromagnetic layer 15, the first nonmagnetic layer 14, the first ferromagnetic layer 13, the base layer 21A, and the hard mask layer are patterned to the shape of the magnetoresistive effect element using a lithographic technique. Subsequently, an interlayer insulating film, which is not shown in the drawings, is formed, the surface of the base layer 21A is exposed, and the wiring connecting to the base layer 21A is formed, thereby completing the magnetic memory.

As has been explained, it is possible to obtain a magnetoresistive effect element having a structure that on the substrate 20, on which the transistor and the wiring are formed, the conductive bonding layers 16b, 16a, the second ferromagnetic layer 15, the first nonmagnetic layer 14, the first ferromagnetic layer 13, and the base layer 21A are formed. In this magnetoresistive effect element, at least one of the first and the second ferromagnetic layers 13, 15 has a single crystal structure, resulting in that the magnetic characteristic of this magnetoresistive effect element is improved as compared with the case where a magnetic body with a polycrystalline structure or amorphous structure used. Accordingly, if this magnetoresistive effect element is used as a storage element of a magnetic memory, such a magnetic memory would have a large capacity, and would be capable of performing magnetization switching with a low current.

Although explanation has been made taking the magnetoresistive effect film 1L shown in FIG. 18 as an example, it is possible to form a magnetoresistive effect element, in which the first and the second ferromagnetic layers 13, 15 have the single crystal structure, using either of the magnetoresistive effect films 1M and 1N shown in FIG. 19 and FIG. 20. If such a magnetoresistive effect element is used as a storage element of a magnetic memory, the magnetic memory would have a large capacity, and would be capable of performing magnetization switching with a low current.

Fourth Embodiment

Figure 23:
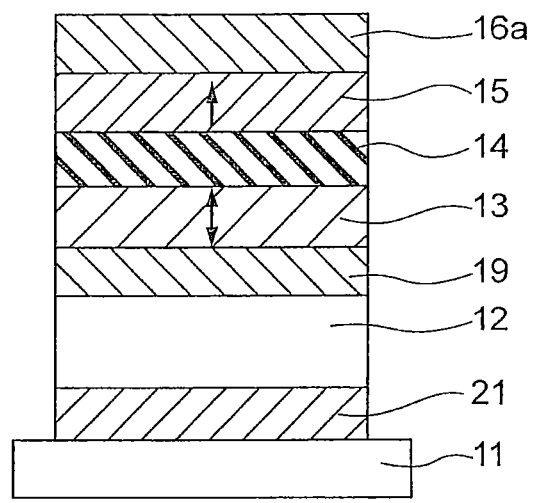
FIG. 23 is a cross-sectional view of a magnetoresistive effect film fabricated by a fabricating method according to a fourth embodiment.

A method of fabricating a magnetic memory according to a fourth embodiment will be explained below. The magnetic memory fabricated by the fabricating method according to the fourth embodiment includes at least one memory cell, which has a magnetoresistive effect element as a storage element. This magnetoresistive effect element has a magnetoresistive effect film. FIG. 23 shows such a magnetoresistive effect film 1O.

The magnetoresistive effect film 1O is fabricated by first preparing a Si(001) single crystal substrate 11 having a diameter of 300 mm, which has a plurality of voids made by a known TSV technique. On the single crystal substrate 11, a base layer 21 of $SrRuO_3$ is formed in vacuum by a sputtering method or MBE method. On the base layer 21, a detachment layer 12 of LiF is formed in vacuum by a sputtering method or MBE method. On the detachment layer 12, a lattice relaxation layer 19 of $SrRuO_3$ is formed in vacuum by a sputtering method or MBE method. On the lattice relaxation layer 19, a first ferromagnetic layer 13 of MnGa is formed in vacuum by a sputtering method or MBE method. On the first ferromagnetic layer 13, a first nonmagnetic layer 14 of MgO is formed in vacuum by a sputtering method or MBE method. On the first nonmagnetic layer 14, a second ferromagnetic layer 15 of MnGa is formed by a sputtering method or MBE method. On the second ferromagnetic layer 15, a metal bonding layer 16a of Ta having a thickness of, for example, 10 nm, is formed in vacuum by a sputtering method or MBE method (FIG. 23). In this manner, the layers are sequentially formed in vacuum by a sputtering method or MBE method to form the magnetoresistive effect element 1O including a ferromagnetic layer with a single crystal structure. Incidentally, in this embodiment, the composition of MnGa is selected so that the first ferromagnetic layer 13 serves as a storage layer, and the second ferromagnetic layer 15 serves as a reference layer. Furthermore, the magnetizing is performed so that the direction of magnetization in the second ferromagnetic layer 15 to serve as a reference layer is perpendicular to the film plane.

Figure 24:
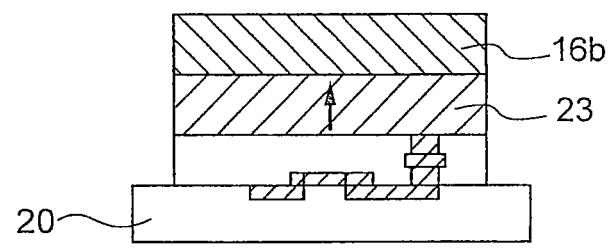
FIG. 24 is a cross-sectional view for explaining the fabricating method according to the fourth embodiment.

Next, as shown in FIG. 24, a substrate 20 having a diameter of 300 mm, on which a transistor and a wiring are formed, is prepared, and on the substrate 20, a ferromagnetic layer 23 to serve as a shift adjustment layer with a magnetization perpendicular to the film plane is formed by a sputtering method. On the ferromagnetic layer 23, a conductive bonding layer 16b of Ta having a thickness of 10 nm is formed by a sputtering method. It is required that the magnetizing of the ferromagnetic layer 23 be performed in such a manner that when the conductive bonding layer 16a formed on the substrate 11 and the conductive bonding layer 16b formed on the substrate 20 are bonded to each other, the direction of the magnetization in the ferromagnetic layer 23 is opposite to the direction of the magnetization in the second ferromagnetic layer 15 to serve as a reference layer. The material of the ferromagnetic layer 23 may be a ferromagnetic material containing Pt or Pd. The conductive bonding layer 16b is electrically connected to the substrate, on which the transistor is formed.

It is desirable that the surface roughness of the conductive bonding layers 16a, 16b thus formed should be 1 nm or less. If the surface roughness is more than 1 nm, it is necessary to smoothen the surface by CMP or the like.

Figure 25:
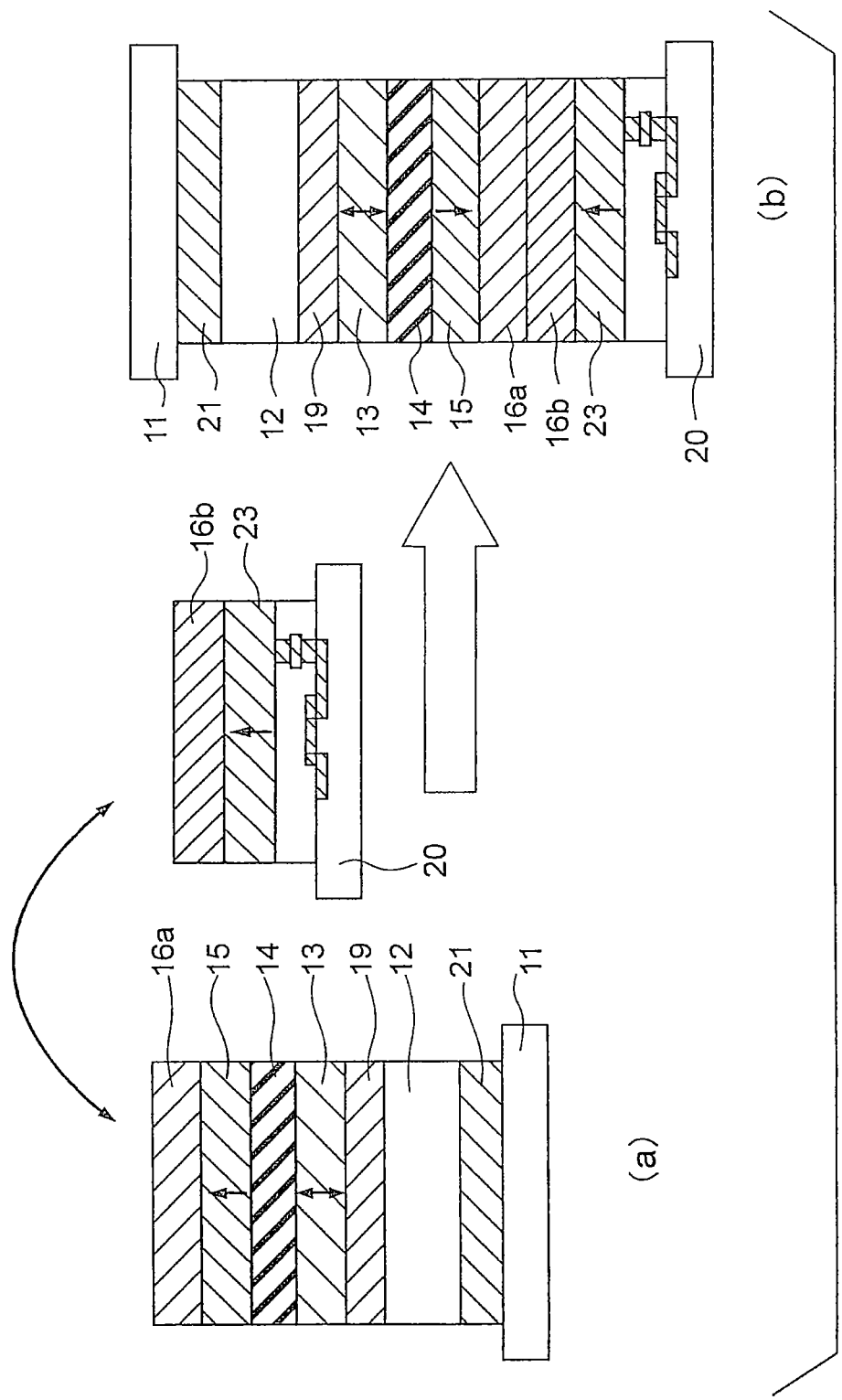
FIGS. 25(a) and 25(b) are cross-sectional views for explaining the fabricating method according to the fourth embodiment.

Next, the conductive bonding layer 16b of the substrate 20 shown in FIG. 14, on which the transistor and the wiring are formed, is bonded to the conductive bonding layer 16a of the substrate 11 shown in FIG. 23, on which the magnetoresistive effect element 1O is formed (FIG. 25(a)). FIG. 25(b) shows the state where the conductive bonding layer 16b is bonded to the conductive bonding layer 16a. The bonding process is performed in an atmosphere where the degree of vacuum is $1.0 \times 10^{-6}$ Pa or less by removing oxides and absorption layers on the surfaces of the conductive bonding layers 16a, 16b of the two substrates by using a Ar ion beam or Ar neutral atom beam, and then applying a pressure loading of 10,000 kgf at an ambient temperature, thereby bonding the two substrates at the conductive bonding layers 16a, 16b. The bonding strength of 10 MPa is obtained for the conductive bonding layers 16a, 16b thus bonded. This is a sufficient bonding strength. Incidentally, as explained in the explanation of the first embodiment, it is possible to improve the bonding strength by performing the bonding in a heat treatment at a temperature of about 200° C., or performing annealing at a temperature of about 200° C. after performing the bonding at an ambient temperature.

Figure 26:
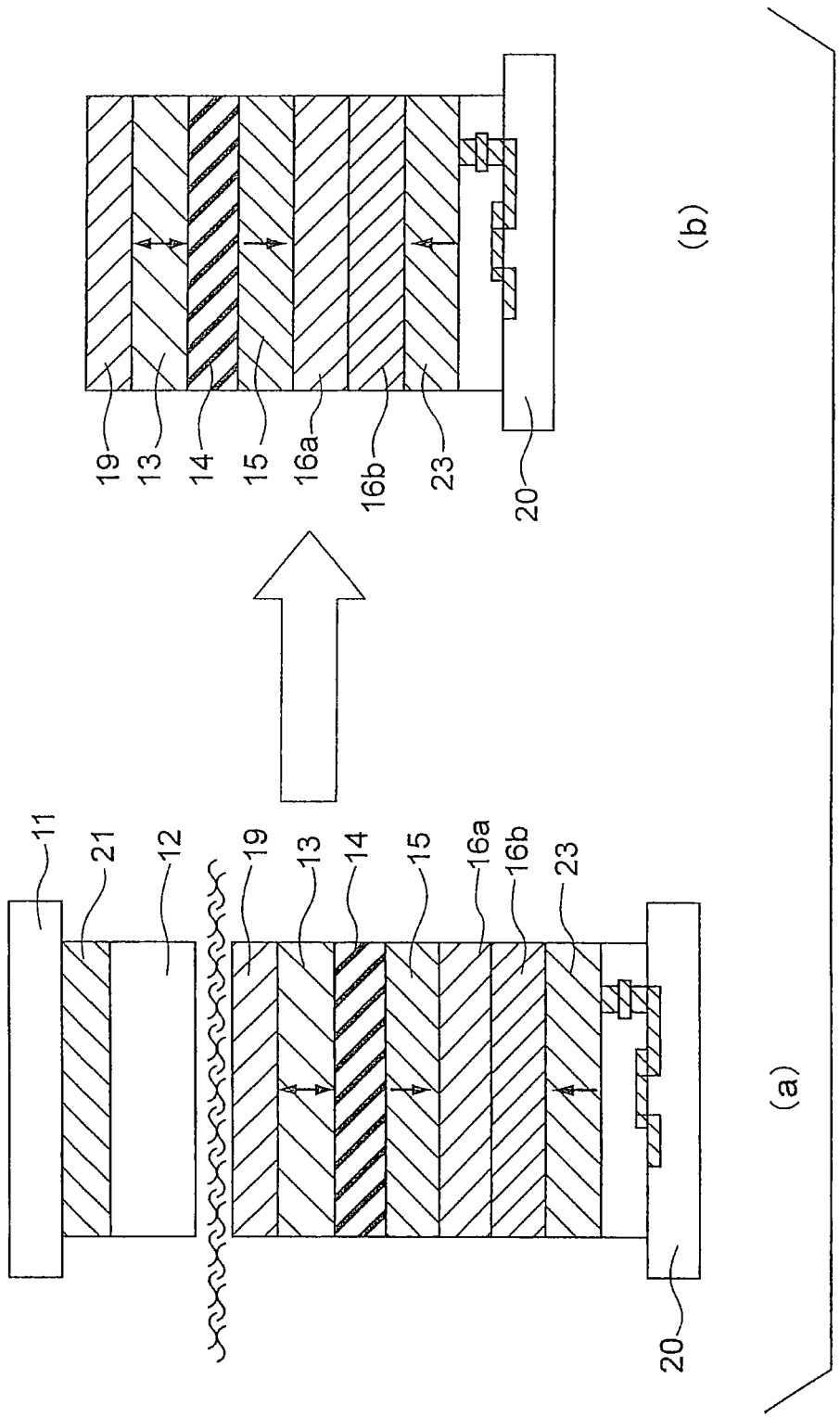
FIGS. 26(a) and 26(b) are cross-sectional views for explaining the fabricating method according to the fourth embodiment.

Next, as shown in FIG. 26(a), the single crystal substrate 11 is detached. As explained in the explanation of the first embodiment, the detachment process is performed by using such means as a spinner, water jet, etc., and the detachment layer 12 that is formed of LiF, which has a high deliquescent property, is easily dissolved into water and detached. Furthermore, by making holes into the single crystal substrate 11 by means of a TSV technique in advance, the permeability of water into the central portion of the single crystal substrate 11 can be improved, resulting in that the single crystal substrate 11 can be easily detached. After the single crystal substrate 11 is detached, the stacked structure including the lattice relaxation layer 19, the first ferromagnetic layer 13, the first nonmagnetic layer 14, the second ferromagnetic layer 15, and the conductive bonding layer 16a is bonded to the substrate 20, on which the conductive bonding layer 16b and the shift adjustment layer 23 are formed.

Incidentally, after the detachment layer 12 is detached, the surface of the lattice relaxation layer 19 on the side of detachment layer 12, which is exposed, can be smoothened by using, for example, CMP, or left exposed without being smoothened. Thereafter, a hard mask layer, which is not shown in the drawings, is formed, and the shift adjustment layer 23, the conductive bonding layers 16b, 16a, the second ferromagnetic layer 15, the first nonmagnetic layer 14, the first ferromagnetic layer 13, the lattice relaxation layer 19, and the hard mask layer are patterned to the shape of the magnetoresistive effect element using a lithographic technique. Subsequently, an interlayer insulating film, which is not shown in the drawings, is formed, the surface of the lattice relaxation layer 19 is exposed by using, for example, CMP, and a wiring connecting to the lattice relaxation layer 19 is formed, thereby completing the magnetic memory.

As has been explained, it is possible to obtain a magnetoresistive effect element having a structure that on the substrate 20, on which the transistor and the wiring are formed, the shift adjustment layer 23, the conductive bonding layer 16b, the conductive bonding layer 16a, the second ferromagnetic layer 15, the first nonmagnetic layer 14, the first ferromagnetic layer 13, and the lattice relaxation layer 19 are formed. In this magnetoresistive effect element, the first and the second ferromagnetic layers 13, 15 have a single crystal structure, resulting in that the magnetic characteristic of this magnetoresistive effect element is improved as compared with the case where a magnetic body with a polycrystalline structure or amorphous structure is used. Accordingly, if this magnetoresistive effect element is used as a storage element of a magnetic memory, such a magnetic memory would have a large capacity, and would be capable of performing magnetization switching with a low current.

Furthermore, in the fourth embodiment, the magnetizing of the second ferromagnetic layer 15 is performed independently of the magnetizing of the shift adjustment layer 23. Accordingly, it is possible to obtain a magnetic field that is stable and in an opposite direction with a magnetic field smaller than that of the first to the third embodiments.

Moreover, in the fabricating method according to the fourth embodiment, if the detachment layer 12A of a hydrogen embrittlement material, which was explained in the explanation of the second embodiment, is formed under a hydrogen atmosphere and used instead of the detachment layer 12, it is possible to detach the single crystal substrate 11 in the same manner as was explained in the explanation of the second embodiment.

Incidentally, although the single crystal substrate 11 is used to form the magnetoresistive effect element in the fourth embodiment, it is not necessary to use a single crystal substrate. In such a case, the ferromagnetic layer of the magnetoresistive effect element does not have a single crystal structure.

Fifth Embodiment

A magnetic memory according to a fifth embodiment will be explained below. The magnetic memory according to the fifth embodiment includes at least one memory cell, which has a magnetoresistive effect element explained in the explanation of any of the first to the fourth embodiments and their modifications as a storage element.

Figure 27:
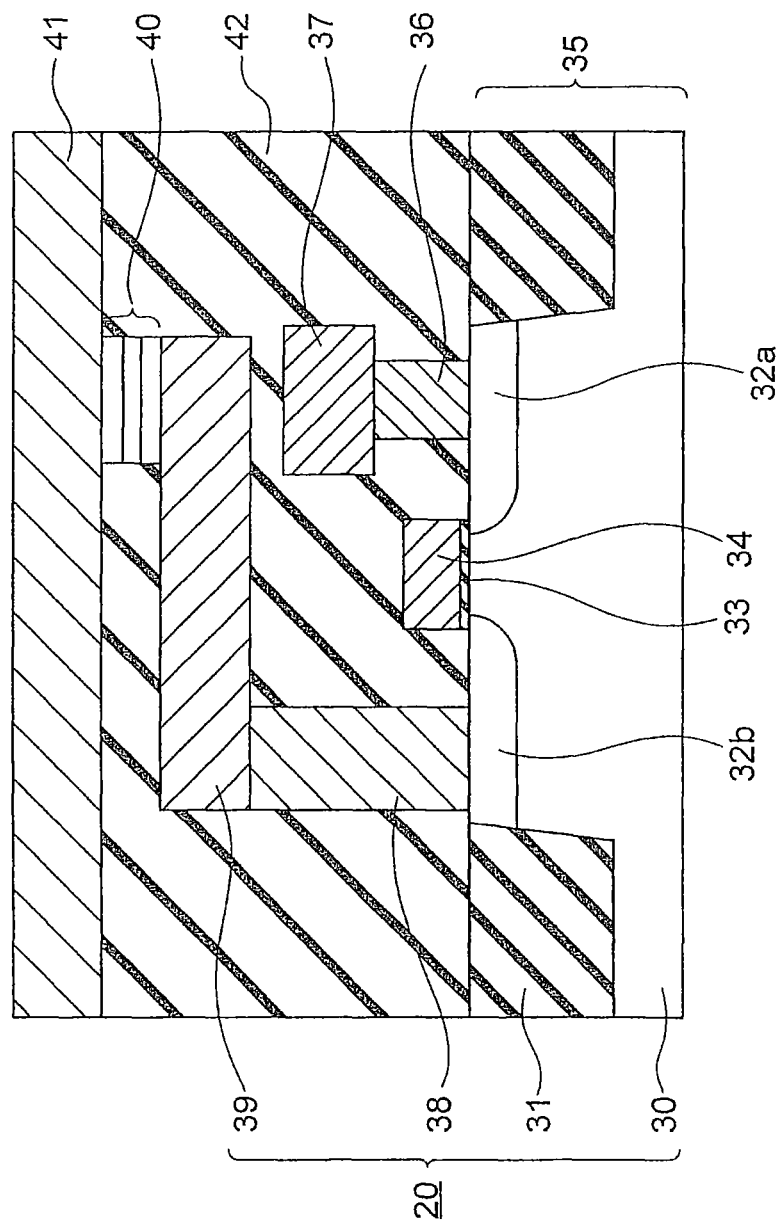
FIG. 27 is a cross-sectional view showing a memory cell of a magnetic memory according to a fifth embodiment.

FIG. 27 shows a cross-sectional view of a memory cell of a magnetic memory according to the fifth embodiment. In the memory cell of the magnetic memory according to the fifth embodiment, an element isolation insulating layer 31 formed by STI (Shallow Trench Isolation) using silicon oxide is provided onto the surface of a p-type semiconductor substrate 30. A surface region of the p-type semiconductor substrate 30, in which the element isolation insulating layer 31 does not exist, is an element region where an element is formed. In the element region, a source electrode 32a and a drain electrode 32, which are formed to be separated from each other, are arranged. Each of the source electrode 32a and the drain electrode 32 is in a region formed by implanting a highly concentrated N+ type impurity into the semiconductor substrate 30. On a region of the semiconductor substrate 30 between the source electrode 32a and the drain electrode 32b (channel region), a gate electrode 34 is formed via a gate insulating film 33. The gate electrode 34 serves as a word line WL. Accordingly, a selection transistor 35 is arranged on the p-type semiconductor substrate 30.

On the source electrode 32a, a wiring layer 37 is arranged via a contact layer 36. The wiring layer 37 serves as a bit line /BL. On the drain electrode 32b, a lead wiring layer 39 is arranged via a contact layer 38. From the lead wiring layer 39 to the semiconductor substrate 30 is the substrate 20, on which the transistor and the wiring are formed, explained in the explanation of the first to the fourth embodiments. On the lead wiring layer 39, a magnetoresistive effect element 40 fabricated by a method according to any of the first to the fourth embodiments and their modifications is formed. On the magnetoresistive effect element 40, an upper electrode wiring layer 41 is arranged. The upper electrode wiring layer 41 serves as a bit line BL. Furthermore, an interlayer insulating layer of silicon oxide is arranged between the semiconductor substrate 30 and the upper electrode wiring layer 41.

Figure 28:
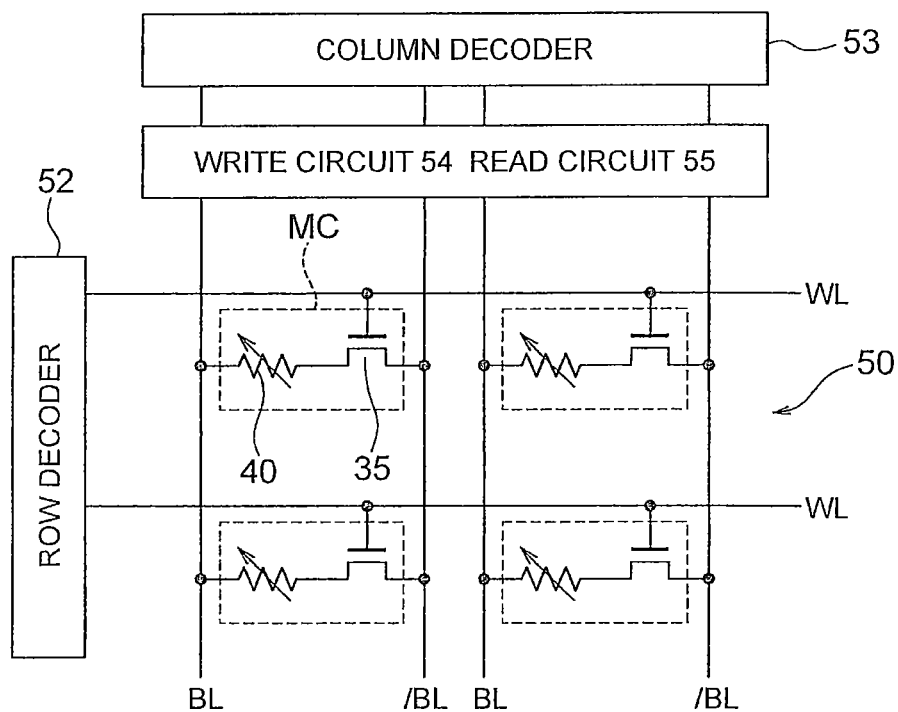
FIG. 28 is a circuit diagram of the magnetic memory according to the fifth embodiment.

Next, the operation of the magnetic memory according to the fifth embodiment will be explained by referring to FIG. 28. The magnetic memory according to the fifth embodiment includes a memory cell array 50 having a plurality of memory cells MC, which are arranged in a matrix form. A plurality of bit line pairs BL, /BL each extending in a column direction are connected to the memory cell array 50. Furthermore, a plurality of word lines WL each extending in a row direction are connected to the memory cell array 50. At an intersection of a word line WL and a bit line BL, a memory cell MC is arranged. Each memory cell MC includes a magnetoresistive effect element 40 fabricated by a method according to any of the first to the fourth embodiments and their modifications and a selection transistor 35, which is an n-channel MOS transistor. One terminal of the magnetoresistive effect element 40 is connected to the bit line BL. The other terminal of the magnetoresistive effect element 40 is connected to a drain terminal of the selection transistor 35. The gate terminal of the selection transistor 35 is connected to the word line WL. The source terminal of the selection transistor 35 is connected to the bit line /BL. A row decoder 52 is connected to the word line WL. A write circuit 54 and a read circuit 55 are connected to the bit line pair BL, /BL. A column decoder 53 is connected to the write circuit 54 and the read circuit 55. Each memory cell MC is selected by the row decoder 52 and the column decoder 53.

The writing of data to a memory cell MC is performed by first activating the word line WL connected to the memory cell MC to select the memory cell MC. As result, the selection transistor 35 is turned on. To the magnetoresistive effect element 40, a write current Iw, which is bidirectional, is supplied depending on the data to be written. When the write current Iw is supplied from the left to the right in the magnetoresistive effect element 40, the write circuit 54 applies a positive voltage to the bit line BL, and a ground voltage to the bit line /BL. When the write current Iw is supplied from the right to the left in the magnetoresistive effect element 40, the write circuit 54 applies a positive voltage to the bit line /BL, and a ground voltage to the bit line BL. In this manner, data "0" or data "1" is written to the memory cell MC.

Next, the reading of data from a memory cell MC is performed by first turning on the selection transistor 35 of the selected memory cell MC. The read circuit 55 supplies a read current Ir, which flows from the right to the left, to the magnetoresistive effect element 40. Based on this read current Ir, the read circuit 55 detects a resistance value of the magnetoresistive effect element 40. In this manner, it is possible to read the data stored in the magnetoresistive effect element 40.

The magnetic memory according to the fifth embodiment includes, as a storage element, a magnetoresistive effect element including a magnetic layer with a single crystal structure. Accordingly, it is possible to obtain a large capacity, and to perform magnetization switching with a low current.

Sixth Embodiment

Figure 29:
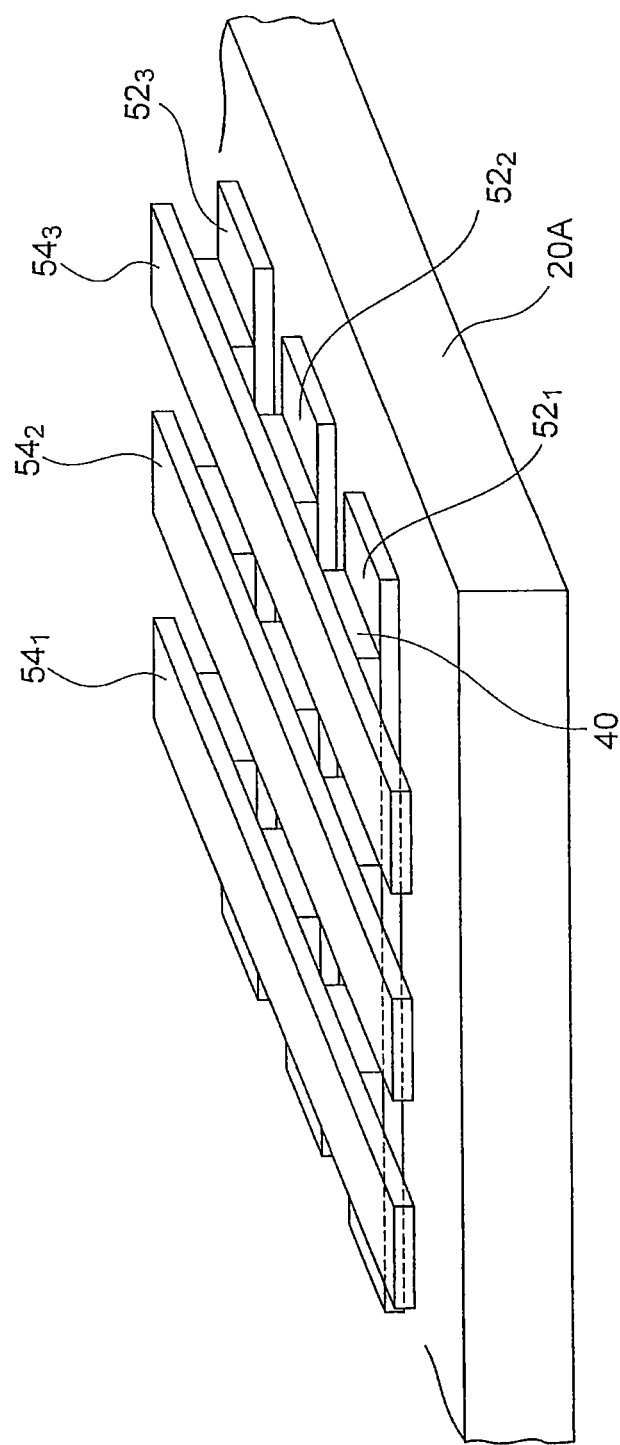
FIG. 29 is a perspective view showing a magnetic memory according to a sixth embodiment.

A magnetic memory according to a sixth embodiment will be explained below, referring to FIGS. 29 to 32. FIG. 29 shows a perspective view of the magnetic memory according to the sixth embodiment. The magnetic memory according to the sixth embodiment includes a plurality of first wirings $52_1$, $52_2$, $52_3$, which are arranged in parallel with each other on a substrate 20A, a plurality of second wirings $54_1$, $54_2$, $54_3$, which are arranged in parallel with each other and intersect the first wirings, and a magnetoresistive effect element 40, which is provided at intersection regions of the first wirings $52_1$, $52_2$, $52_3$ and the second wirings $54_1$, $54_2$, $54_3$. That is to say, the magnetic memory according to the sixth embodiment is of cross-point type.

Figure 30:
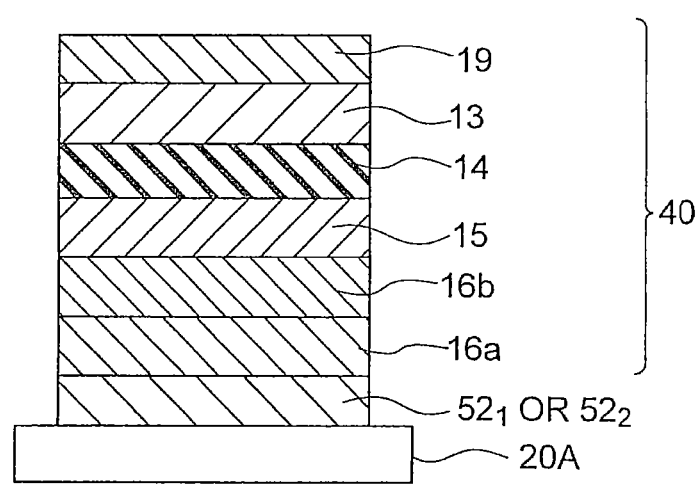
FIG. 30 is a cross-sectional view of a magnetoresistive effect film used for the magnetic memory according to the sixth embodiment.

The magnetoresistive effect element 40 is fabricated by the fabricating method according to any of the first to the third embodiments. Furthermore, an integrated circuit (now shown in the drawing) for driving the magnetoresistive effect film 40 may be formed on the substrate 20A. FIG. 30 shows an example of the magnetoresistive effect film 40. The magnetoresistive effect film 40 of this example is formed on the first wiring, and has structure in which a conductive bonding layer 16a, a conductive bonding layer 16b, a ferromagnetic layer 15, a nonmagnetic layer 14, a ferromagnetic layer 13, and a lattice relaxation layer 19 are formed in this order.

The magnetic memory of the sixth embodiment with such a structure includes, as a storage element, a magnetoresistive effect element having a magnetic layer with a single crystal structure. Accordingly, it is possible to obtain a large capacity, and to perform magnetization switching with a low current.

Hereinafter, examples of the magnetoresistive effect element 40 used for the magnetic memory according to the sixth embodiment will be explained with reference to FIGS. 31 and 32. FIGS. 31 and 32 show specific structures of the conductive bonding layer 16a, the conductive bonding layer 16b, the ferromagnetic layer 13, the ferromagnetic layer 15, and the nonmagnetic layer 14, in the first to the thirteenth examples of the magnetoresistive effect element 40, and the fourteenth to the twenty-sixth examples thereof, respectively.

First Example

A first example of the magnetoresistive effect element 40 is fabricated by the fabricating method according to the first embodiment. That is to say, on the substrate 20A, on which the first wirings $52_1$, $52_2$, $52_3$ are formed, a magnetoresistive effect film 40 is formed, the magnetoresistive effect element 40 being with a stacked structure including a conductive bonding layer 16a of Ta having a thickness of 10 nm, a conductive bonding layer 16b of Ta having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Second Example

A second example of a magnetoresistive effect element 40 is fabricated by the fabricating method according to the first embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ti having a thickness of 10 nm, a conductive bonding layer 16b of Ta having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Third Example

A third example of the magnetoresistive effect element 40 is fabricated by the fabricating method according to the third embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ti having a thickness of 10 nm, a conductive bonding layer 16b of Ti having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ti is used to form the conductive bonding layer 16b that contacts the ferromagnetic layer 15 of single crystal structure MnGa, Ti functions as a diffusion barrier layer when a temperature of 300° C.-400° C. is applied during the processing of the element, so that the single crystal structure of MnGa is not damaged.

Fourth Example

A fourth example of the magnetoresistive effect element 40 is fabricated by the fabricating method according to the second embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b of Ti having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

The same effect as that of the third example can be obtained from the fourth example.

Fifth Example

A fifth example of the magnetoresistive effect element 40 is fabricated by the fabricating method according to the first embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a formed by stacking 3 nm-thick Ti and 5 nm-thick Cu in this order, a conductive bonding layer 16b of Ta having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Furthermore, the use of Cu, whose atom has a high diffusion coefficient, to form the conductive bonding layer 16a is advantageous since the Cu atoms diffuse at the junction interface, thereby increasing the bonding strength at the junction interface.

Sixth Example

A sixth example of the magnetoresistive effect element 40 is fabricated by the fabricating method according to the third embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b, in which a 2 nm-thick Ru and a 10 nm-thick Ta are stacked in this order, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Seventh Example

A seventh example of the magnetoresistive effect element 40 is fabricated by the fabricating method according to the second embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a, in which 3 nm-thick Ti and 5 nm-thick Cu are stacked in this order, a conductive bonding layer 16b of Ti having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When Ti is used to form the conductive bonding layer 16b that contacts the ferromagnetic layer 15 of single crystal structure MnGa, Ti functions as a diffusion barrier layer when a temperature of 300° C.-400° C. is applied during the processing of the element, so that the single crystal structure of MnGa is not damaged.

Furthermore, the use of Cu, whose atom has a high diffusion coefficient, to form the conductive bonding layer 16a is advantageous since the Cu atoms diffuse at the junction interface, thereby increasing the bonding strength at the junction interface.

Eighth Example

An eighth example of the magnetoresistive effect element 40 is fabricated by the fabricating method according to the second embodiment. That is to say, on the substrate 20A, on which first wirings $52_1, 52_2, 52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b of TiN having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm.

When TiN is used to form the conductive bonding layer 16b that contacts the ferromagnetic layer 15 of single crystal structure MnGa, TiN functions as a diffusion barrier layer when a temperature of 300° C.-400° C. is applied during the processing of the element, so that the single crystal structure of MnGa is not damaged.

Ninth Example

A ninth example of the magnetoresistive effect element 40 is fabricated by the fabricating method according to the first embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b of TaN having a thickness of 10 nm, a ferromagnetic layer 15 of single crystal structure MnGa having a thickness of 30 nm, a nonmagnetic layer 14 of MgO having a thickness of 1 nm, and a ferromagnetic layer 13 of single crystal structure MnGa having a thickness of 10 nm. Thereafter, the second wirings $54_1$-$54_3$ are formed.

When TaN is used to form the conductive bonding layer 16b that contacts the ferromagnetic layer 15 of single crystal structure MnGa, TaN functions as a diffusion barrier layer when a temperature of 300° C.-400° C. is applied during the processing of the element, so that the single crystal structure of MnGa is not damaged.

Tenth Example

A tenth example of the magnetoresistive effect element 40 is fabricated by the fabricating method according to the third embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15 of single crystal structure MnGa having a thickness of 30 nm, a nonmagnetic layer 14 of $SrTiO_3$ having a thickness of 1.8 nm, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Eleventh Example

An eleventh example of the magnetoresistive effect element 40 is fabricated by the fabricating method according to the second embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15 of single crystal structure MnGa having a thickness of 30 nm, a nonmagnetic layer 14 of MgO having a thickness of 1.0 nm, and a ferromagnetic layer 13, in which single crystal structure MnGa having a thickness of 10 nm and single crystal structure MnAl having a thickness of 1 nm are stacked in this order.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Twelfth Example

A twelfth example of the magnetoresistive effect element 40 is fabricated by the fabricating method according to the first embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15, in which single crystal structure MnGa having a thickness of 30 nm and single crystal structure MnAl having a thickness of 2 nm are stacked in this order, a nonmagnetic layer 14 of MgO having a thickness of 1.0 nm, and a ferromagnetic layer 13 in which single crystal structure MnGa having a thickness of 10 nm and single crystal structure MnAl having a thickness of 1 nm are stacked in this order.

When Ta is used to form the conductive bonding layer 16b that contacts the ferromagnetic layer 15 containing single crystal structure MnGa and single crystal structure MnAl, Ta functions as a diffusion barrier layer when a temperature of 300° C.-400° C. is applied during the processing of the element, so that the single crystal structure of the ferromagnetic layer 15 containing MnGa and MnAl is not damaged.

Thirteenth Example

A thirteenth example of the magnetoresistive effect element 40 is fabricated by the fabricating method according to the first embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15 of single crystal structure CoFe having a thickness of 30 nm, a nonmagnetic layer 14 of MgO having a thickness of 1.0 nm, and a ferromagnetic layer 13 of single crystal structure MnGa having a thickness of 10 nm.

When Ta is used to form the conductive bonding layer 16b that contacts the ferromagnetic layer 15 of single crystal structure CoFe, Ta functions as a diffusion barrier layer when a temperature of 300° C.-400° C. is applied during the processing of the element, so that the single crystal structure of CoFe is not damaged.

Fourteenth Example

A fourteenth example of the magnetoresistive effect element 40 is fabricated by the fabricating method according to the second embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15 of single structure $TbFe_2$ having a thickness of 30 nm, a nonmagnetic layer 14 of MgO having a thickness of 1.0 nm, and a ferromagnetic layer 13 of single crystal structure MnGa having a thickness of 10 nm.

When Ta is used to form the conductive bonding layer 16b that contacts the ferromagnetic layer 15 of single crystal structure $TbFe_2$, Ta functions as a diffusion barrier layer when a temperature of 300° C.-400° C. is applied during the processing of the element, so that the single crystal structure of $TbFe_2$ is not damaged.

Fifteenth Example

A fifteenth example of the magnetoresistive effect element 40 is fabricated by the fabricating method according to the second embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b of Ta having a thickness of 10 nm, a ferromagnetic layer 15, in which single crystal structure MnGa having a thickness of 30 nm and single crystal structure CoFe having a thickness of 1 nm are stacked in this order, a nonmagnetic layer 14 of MgO having a thickness of 1.0 nm, and a ferromagnetic layer 13, in which single crystal structure MnGa having a thickness of 10 nm and single crystal structure CoFe having a thickness of 1 nm are stacked in this order.

When Ta is used to form the conductive bonding layer 16b that contacts the ferromagnetic layer 15 containing single crystal structure MnGa and single crystal structure CoFe, Ta functions as a diffusion barrier layer when a temperature of 300° C.-400° C. is applied during the processing of the element, so that the single crystal structure of the ferromagnetic layer 15 containing MnGa and CoFe is not damaged.

Sixteenth Example

A sixteenth example of the magnetoresistive effect element 40 is fabricated by the fabricating method according to the first embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a of Ta having a thickness of 10 nm, a conductive bonding layer 16b of Ta having a thickness of 10 nm, a ferromagnetic layer 15, in which single crystal structure MnGa having a thickness of 30 nm and single crystal structure CoFeB having a thickness of 1 nm are stacked in this order, a nonmagnetic layer 14 of MgO having a thickness of 1.0 nm, and a ferromagnetic layer 13, in which single crystal structure MnGa having a thickness of 10 nm and single crystal structure CoFeB having a thickness of 1 nm are stacked in this order.

With the sixteenth example, it is possible to obtain the same effect as that of the fifteenth example.

Seventeenth Example

A seventeenth example of the magnetoresistive effect element 40 is fabricated by the fabricating method according to the first embodiment. That is to say, on the substrate 20A, on which the first wirings $52_1, 52_2, 52_3$ are formed, a magnetoresistive effect element 40 is formed, the magnetoresistive effect element 40 being with a stacked structure including a conductive bonding layer 16a, in which Ti with a thickness of 3 nm and Cu with a thickness of 5 nm are stacked in this order, a conductive bonding layer 16b of Ta having a thickness of 10 nm, a ferromagnetic layer 15, in which MnGa with a thickness of 30 nm and CoFeB with a thickness of 1 nm are stacked in this order, a nonmagnetic layer 14 of MgO having a thickness of 1.0 nm, and a ferromagnetic layer 13 of MnGa having a thickness of 10 nm.

The use of Cu, whose atom has a high diffusion coefficient, to form the conductive bonding layer 16a is advantageous since the Cu atoms diffuse at the junction interface, thereby increasing the bonding strength at the junction interface.

Eighteenth Example

An eighteenth example of the magnetoresistive effect element 40 is fabricated by the fabricating method according to the second embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a, in which Ta with a thickness of 5 nm and Cu with a thickness of 3 nm are stacked in this order, a conductive bonding layer 16b of Ta having a thickness of 10 nm, a ferromagnetic layer 15 of single crystal structure MnGa having a thickness of 30 nm, a nonmagnetic layer 14 of MgO having a thickness of 1.0 nm, and a ferromagnetic layer 13 of single crystal structure MnGa having a thickness of 10 nm.

With the eighteenth example, it is possible to obtain the same effect as that of the seventeenth example.

Nineteenth Example

A nineteenth example of the magnetoresistive effect element 40 is fabricated by the fabricating method according to the first embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a, in which Ta with a thickness of 5 nm and Cu with a thickness of 3 nm are stacked in this order, a conductive bonding layer 16b, in which Ta with a thickness of 5 nm and Cu with a thickness of 3 nm are stacked in this order, a ferromagnetic layer 15 of single crystal structure MnGa having a thickness of 30 nm, a nonmagnetic layer 14 of MgO having a thickness of 1.0 nm, and a ferromagnetic layer 13 of single crystal structure MnGa having a thickness of 10 nm.

With the nineteenths example, it is possible to obtain the same effect as that of the seventeenth example.

Twentieth Example

A twentieth example of the magnetoresistive effect element 40 is fabricated by the fabricating method according to the second embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a of Ta having a thickness of 10 nm, a conductive bonding layer 16b of Ta having a thickness of 10 nm, a ferromagnetic layer 15 of single crystal structure MnGa having a thickness of 10 nm, a nonmagnetic layer 14 of MgO having a thickness of 1.0 nm, and a ferromagnetic layer 13 of single crystal structure MnGa having a thickness of 30 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Twenty-First Example

A twenty-first example of the magnetoresistive effect element 40 is fabricated by the fabricating method according to the second embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a of Ti having a thickness of 5 nm, a conductive bonding layer 16b of Ta having a thickness of 5 nm, a ferromagnetic layer 15 of single crystal structure MnGa having a thickness of 10 nm, a nonmagnetic layer 14 of MgO having a thickness of 1.0 nm, and a ferromagnetic layer 13 of single crystal structure MnGa having a thickness of 30 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during processing of the element, so that the single crystal structure of MnGa is not damaged.

Twenty-Second Example

A twenty-second example of the magnetoresistive effect element 40 is fabricated by the fabricating method according to the first embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a, in which Ta with a thickness of 5 nm and Cu with a thickness of 3 nm are stacked in this order, a conductive bonding layer 16b of Ta having a thickness of 10 nm, a ferromagnetic layer 15 of single crystal structure MnGa having a thickness of 10 nm, a nonmagnetic layer 14 of MgO having a thickness of 1.0 nm, and a ferromagnetic layer 13 of single crystal structure MnGa having a thickness of 30 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of MnGa is not damaged.

Twenty-Third Example

A twenty-third example of the magnetoresistive effect element 40 is fabricated by the fabricating method according to the second embodiment. That is to say, on the substrate 20A, on which the first wirings 52₁, 52₂, 52₃ are formed, a magnetoresistive effect element 40 is formed, the magnetoresistive effect element 40 being with a stacked structure including a conductive bonding layer 16a of Ta having a thickness of 10 nm, a conductive bonding layer 16b of Ta having a thickness of 10 nm, a ferromagnetic layer 15, in which single crystal structure MnGa with a thickness of 10 nm and single crystal structure MnAl with a thickness of 1 nm are stacked in this order, a nonmagnetic layer 14 of MgO having a thickness of 1.0 nm, and a ferromagnetic layer 13, in which single crystal structure MnGa with a thickness of 30 nm and single crystal structure MnAl with a thickness of 2 nm are stacked in this order.

When Ta is used to form the conductive bonding layer 16b that contacts the ferromagnetic layer 15 containing single crystal structure MnGa and single crystal structure MnAl, Ta functions as a diffusion barrier layer when a temperature of 300° C.-400° C. is applied during the processing of the element, so that the single crystal structure of the ferromagnetic layer 15 containing MnGa and MnAl is not damaged.

Twenty-Fourth Example

A twenty-fourth example of the magnetoresistive effect element 40 is fabricated by the fabricating method according to the third embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15, in which single crystal structure MnGa with a thickness of 10 nm and single crystal structure CoFe with a thickness of 1 nm are stacked in this order, a nonmagnetic layer 14 of MgO having a thickness of 1.0 nm, and a ferromagnetic layer 13, in which single crystal structure MnGa with a thickness of 30 nm and single crystal structure CoFe with a thickness of 1 nm are stacked in this order.

When Ta is used to form the conductive bonding layer 16b that contacts the ferromagnetic layer 15 containing single crystal structure MnGa and single crystal structure CoFe, Ta functions as a diffusion barrier layer when a temperature of 300° C.-400° C. is applied during the processing of the element, so that the single crystal structure of the ferromagnetic layer 15 containing MnGa and CoFe is not damaged.

Twenty-Fifth Example

A twenty-fifth example of the magnetoresistive effect element 40 is fabricated by the fabricating method according to the first embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15, in which single crystal structure MnGa with a thickness of 10 nm and single crystal structure CoFeB with a thickness of 1 nm are stacked in this order, a nonmagnetic layer 14 of MgO having a thickness of 1.0 nm, and a ferromagnetic layer 13, in which single crystal structure MnGa having a thickness of 30 nm and single crystal structure CoFeB having a thickness of 1 nm are stacked in this order.

When Ta is used to form the conductive bonding layer 16b that contacts the ferromagnetic layer 15 containing single crystal structure MnGa and single crystal structure CoFeB, Ta functions as a diffusion barrier layer when a temperature of 300° C.-400° C. is applied during the processing of the element, so that the single crystal structure of the ferromagnetic layer 15 containing MnGa and CoFeB is not damaged.

Twenty-Sixth Example

A twenty-sixth example of the magnetoresistive effect element 40 is fabricated by the fabricating method according to the first embodiment. That is to say, on the substrate 20A, on which the first wirings $52_1$, $52_2$, $52_3$ are formed, a magnetoresistive effect element 40 is formed, the magnetoresistive effect element 40 being with a stacked structure including a conductive bonding layer 16a of Ta having a thickness of 5 nm, a conductive bonding layer 16b of Ta having a thickness of 5 nm, a ferromagnetic layer 15 of single crystal structure MnGa having a thickness of 30 nm, a nonmagnetic layer 14, in which MgO with a thickness of 0.4 nm, $SrTiO_3$ with a thickness of 1.8 nm, and MgO with a thickness of 0.4 nm are stacked in this order, and a ferromagnetic layer 13 of single crystal structure MnGa having a thickness of 10 nm.

When Ta is used to form the conductive bonding layer 16b that contacts the ferromagnetic layer 15 of single crystal structure MnGa, Ta functions as a diffusion barrier layer when a temperature of 300° C.-400° C. is applied during the processing of the element, so that the single crystal structure of the ferromagnetic layer 15 containing MnGa is not damaged.

In the first to the twenty-sixth examples, if the conductive bonding layer 16b has a microcrystal or amorphous structure, there is an advantage in that the single crystal structure of the ferromagnetic layer 15 is not damage by the internal stress.

It is possible to use the magnetoresistive effect element 40 of any of the first to the twenty-sixth examples as the magnetoresistive effect element 40 of the memory cell in the memory according to the fifth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A method of fabricating a magnetic memory comprising:
forming a separation layer on a first substrate;
sequentially forming a first ferromagnetic layer, a first nonmagnetic layer, and a second ferromagnetic layer on the separation layer, at least one of the first and the second ferromagnetic layers having a single crystal structure;
forming a first conductive bonding layer on the second ferromagnetic layer;
forming a second conductive bonding layer on a second substrate, on which a transistor and a wiring are formed, the second conductive layer being electrically connected to the transistor;
arranging the first substrate and the second substrate so that the first conductive bonding layer and the second conductive bonding layer are opposed to each other, and bonding the first and the second conductive bonding layers to each other; and
separating the first substrate from the first ferromagnetic layer by using the separation layer.

2. The method according to claim 1, wherein the separation layer contains a deliquescent material, and the separating of the first substrate is performed by dissolving the separation layer into water.

3. The method according to claim 1, wherein the separation layer contains at least one of a fluoride containing at least one element selected from the group consisting of Li, Na, K, Rb, and Cs, a chloride containing at least one element selected from the group consisting of Na, Mg, Ca, Sr, and Ba, and an oxide containing at least one element selected from the group consisting of Li, Na, K, Rb, and Cs.

4. The method according to claim 1, wherein the separation layer contains a material having an embrittlement function and containing hydrogen or helium, and the forming of the separation layer is performed under an atmosphere containing hydrogen or helium.

5. The method according to claim 4, wherein the separating of the first substrate is performed by applying an impactive force to the separation layer.

6. The method according to claim 1, wherein the separation layer contains a hydrogen absorbing alloy or material with a perovskite structure.

7. The method according to claim 1, further comprising forming a base layer on the first substrate before the forming of the separation layer, the separation layer being formed on the base layer.

8. The method according to claim 7, wherein the base layer comprises one layer selected from the group consisting of:
- a layer of nitride having a {001}-oriented NaCl structure, and containing at least one element selected from the group consisting of Ti, Zr, Nb, V, Hf, Ta, Mo, W, B, Al, and Ce;
- a {001}-oriented perovskite oxide layer of $ABO_3$, in which the A-site contains at least one element selected from the group consisting of Sr, Ce, Dy, La, K, Ca, Na, Pb, and Ba, and the B-site contains at least one element selected from the group consisting of Ti, V, Cr, Mn, Fe, Co, Ni, Ga, Nb, Mo, Ru, Ir, Ta, Ce, and Pb;
- a layer of oxide having a {001}-oriented NaCl structure, and containing at least one element selected from the group consisting of Mg, Al, and Ce; and
- a layer having a {001}-oriented tetragonal structure or cubic structure, and containing at least one element selected from the group consisting of Al, Cr, Fe, Co, Rh, Pd, Ag, Ir, Pt, and Au.

9. The method according to claim 1, further comprising forming a lattice relaxation layer on the separation layer before the forming of the first ferromagnetic layer.

10. The method according to claim 9, wherein the lattice relaxation layer includes one layer selected from the group consisting of:
- a layer of nitride having a {001}-oriented NaCl structure, and containing at least one element selected from the group consisting of Ti, Zr, Nb, V, Hf, Ta, Mo, W, B, Al, and Ce;
- a {001}-oriented perovskite oxide layer of $ABO_3$, in which the A-site contains at least one element selected from the group consisting of Sr, Ce, Dy, La, K, Ca, Na, Pb, and Ba, and the B-site contains at least one element selected from the group consisting of Ti, V, Cr, Mn, Fe, Co, Ni, Ga, Nb, Mo, Ru, Ir, Ta, Ce, and Pb;
- a layer of oxide having a {001}-oriented NaCl structure, and containing at least one element selected from the group consisting of Mg, Al, and Ce; and
- a layer having a {001}-oriented tetragonal structure or cubic structure, and containing at least one element selected from the group consisting of Al, Cr, Fe, Co, Rh, Pd, Ag, Ir, Pt, and Au.

11. The method according to claim 1, further comprising forming a second nonmagnetic layer on the second ferromagnetic layer and forming a third ferromagnetic layer on the second nonmagnetic layer before the forming of the first conductive bonding layer, wherein when the first and the second conductive bonding layers are bonded to each other, the direction of magnetization of the third ferromagnetic layer is opposite to that of the second ferromagnetic layer.

12. The method according to claim 1, further comprising forming a third ferromagnetic layer on the separation layer and forming a second ferromagnetic layer on the third ferromagnetic layer before forming the first ferromagnetic layer, wherein when the first and the second conductive bonding layers are bonded to each other, the direction of magnetization of the third ferromagnetic layer is opposite to that of the first ferromagnetic layer.

13. The method according to claim 1, further comprising forming a fourth ferromagnetic layer on the second substrate before the forming of the second conductive bonding layer on the second substrate, the second conductive bonding layer being formed on the fourth ferromagnetic layer, wherein when the first and the second conductive bonding layers are bonded to each other, the direction of magnetization of the fourth ferromagnetic layer is opposite to that of the second ferromagnetic layer.

14. The method according to claim 1, wherein the first and the second conductive bonding layers contain a metal, nitride, boride, oxide, or carbide containing at least one element selected from the group consisting of Au, Cu, Pt, Ag, Al, Ta, Ti, W, Cr, Mo, V, Nb, Zr, Hf, Mg, Ru, and the first and the second conductive bonding layers are formed of the same material or different materials.

15. The method according to claim 1, wherein the first substrate is a single crystal substrate of a material selected from the group consisting of Si, MgO, $Al_2O_3$, $SrTiO_3$, $MgAl_2O_4$, and $TiO_2$.

16. The method according to claim 1, wherein the first and the second ferromagnetic layers include any of:
- a magnetic layer containing at least one element selected from the group consisting of Mn, Ga, and Al;
- a magnetic layer containing at least one element selected from the group consisting of Fe, Co, and Ni;
- a magnetic layer containing at least one element selected from the group consisting of Fe, Co, and Ni, and at least one element selected from the group consisting of Cr, Pt, Pd, Ir, Rh, Ru, Os, Re, Au, and Cu; and
- a magnetic layer containing at least one element selected from the group consisting of Fe, Co, and Ni, and at least one element selected from the group consisting of Tb, Dy, Sm, Er, and Tm.

* * * * *